(12) United States Patent
Motoki et al.

(10) Patent No.: US 7,354,477 B2
(45) Date of Patent: Apr. 8, 2008

(54) METHOD OF GROWING GAN CRYSTAL, METHOD OF PRODUCING SINGLE CRYSTAL GAN SUBSTRATE, AND SINGLE CRYSTAL GAN SUBSTRATE

(75) Inventors: Kensaku Motoki, Hyogo (JP); Ryu Hirota, Hyogo (JP); Takuji Okahisa, Hyogo (JP); Seiji Nakahata, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 736 days.

(21) Appl. No.: 10/936,512

(22) Filed: Sep. 9, 2004

(65) Prior Publication Data

US 2005/0076830 A1   Apr. 14, 2005

(51) Int. Cl.
*C30B 21/08* (2006.01)

(52) U.S. Cl. ............................. 117/94; 117/95; 117/96; 117/101; 117/104; 257/74; 257/75; 257/101

(58) Field of Classification Search .................. 117/94, 117/95, 96, 101, 104; 257/74, 75, 101
See application file for complete search history.

(56) References Cited

U.S. PATENT DOCUMENTS

| | | | |
|---|---|---|---|
| 6,091,085 A * | 7/2000 | Lester | 257/98 |
| 6,815,728 B2 * | 11/2004 | Tsuda et al. | 257/98 |
| 6,841,274 B2 * | 1/2005 | Ueno et al. | 428/698 |
| 2003/0001168 A1 * | 1/2003 | Tsuda et al. | 257/103 |
| 2005/0095861 A1 * | 5/2005 | Ueno et al. | 438/689 |
| 2005/0179130 A1 * | 8/2005 | Tanaka et al. | 257/730 |

FOREIGN PATENT DOCUMENTS

| | | |
|---|---|---|
| EP | 0 966 047 A | 12/1999 |
| EP | 1 041 610 A | 10/2000 |
| EP | 1 088 914 A | 4/2001 |
| JP | 9-298300 | 10/1997 |

(Continued)

OTHER PUBLICATIONS

Powell, A.R. "New Approach to growth of low dislocation relaxed SiGe material." Applied Physics Letter, 64 (14) Apr. 4, 1994, pp. 1856-1858.

(Continued)

*Primary Examiner*—Robert Kunemund
(74) *Attorney, Agent, or Firm*—McDermott Will & Emery LLP

(57) ABSTRACT

A low dislocation density GaN single crystal substrate is made by forming a seed mask having parallel stripes regularly and periodically aligning on an undersubstrate, growing a GaN crystal on a facet-growth condition, forming repetitions of parallel facet hills and facet valleys rooted upon the mask stripes, maintaining the facet hills and facet valleys, producing voluminous defect accumulating regions (H) accompanying the valleys, yielding low dislocation single crystal regions (Z) following the facets, making C-plane growth regions (Y) following flat tops between the facets, gathering dislocations on the facets into the valleys by the action of the growing facets, reducing dislocations in the low dislocation single crystal regions (Z) and the C-plane growth regions (Y), and accumulating the dislocations in cores (S) or interfaces (K) of the voluminous defect accumulating regions (H).

43 Claims, 13 Drawing Sheets

Prism shaped growth of the present invention

FOREIGN PATENT DOCUMENTS

| JP | 10-9008 | 1/1998 |
|----|---------|--------|
| JP | 2001-102307 | 4/2001 |
| WO | WO 99/23693 | 5/1999 |

OTHER PUBLICATIONS

Miyake, H et al., "Fabrication of GaN with buried tungsten (W) structures using epitaxial lateral overgrowth (ELO) via LP-MOVPE" GaN and Related Alloys—1999. Symposium (Materials Research Society Symposium Proceedings vol. 595), GaN and Related Alloys—1999. Symposium, Boston, MA, USA, Nov. 28-Dec. 3, 1999. 'Online! pp. W2.3.1.-W2.3.6, XP002228660.

Kuan, T S et al., "Dislocation mechanisms in the GaN lateral overgrowth by hydride vapor phase epitaxy", GaN and Related Alloys—1999. Symposium (Materials Research Society Symposium Proceedings vol. 595), GaN and Related Alloys—1999. Symposium, Boston, MA, USA, Nov. 28-Dec. 3, 1999, 'Online!, pp. W2.6.1-W2.6.6, XP002228659.

Zhang, et al., "Epitaxial lateral overgrowth of GaN with chloride-based growth chemistries in both hydride and metalorganic vapor phase epitaxy", GaN and Related Alloys, Symposium, GaN and Related Alloys, Symposium, Boston, MA, USA, Nov. 30-Dec. 4, 1998, 'Online!, p. G4. 7/6 pp. XP002228658.

Kawaguchi, Y. et al., "Selective area growth (SAG) and epitaxial lateral overgrowth (ELO) of GaN using tungsten mask", GaN and Related Alloys, Symposium, GaN and Related Alloys, Symposium, Boston, MA, USA, Nov. 30-Dec. 4, 1998, 'Online!, p. G4 1/6 pp. XP002228657.

Li, X et al., "Characteristics of GaN stripes grown by selective-area metalorganic chemical vapor deposition", Proceedings of the 38th Electronic Materials Conference, Santa Barbara, CA, USA, Jun. 26-28, 1996, vol. 26, No. 3, pp. 306-310, XP009004611.

Wu, J et al., "Selective growth of cubic GaN on patterned GaAs (100) substrates by metalorganic vapor phase epitaxy", 3rd International Conference on Nitride Semiconductors, Montpellier, France, Jul. 4-9, 1999, 'Online!, vol. 176, No. 1, pp. 557-560, XP002228656.

Kapolnek, D et al. "Anisotropic Epitaxial Lateral Growth in GaN Selective Area Epitaxy", Applied Physics Letters, American Institute of Physics, New York, US, vol. 71, No. 9, Sep. 1, 1997, pp. 1204-1206, XP000720234.

Akasaka, T et al., "GaN Hexagonal Microprisms with Smooth Vertical Facets Fabricated by Selective Metalorganic Vapor Phase Epitaxy", Applied Physics Letters, American Institute of Physics, New York, US, vol. 71, No. 15, Oct. 13, 1997, pp. 2196-2198, XP000725873.

Usui, A et al., "Thick GaN Epitaxial Growth With Low Dislocation Density by Hydride Vapor Phase Epitaxy", Japanese Journal of Applied Physics, Publication Office Japanese Journal of Applied Physics. Tokyo, JP, vol. 36., No. 7B, Part 2, Jul 15, 1997, pp. L899-L902, XP000742410.

Beaumont, B, et al., Lateral Overgrowth of GaN on Patterned GaN/Sapphire Substrate Via Selective Metal Organic Vapour Phase Epitaxy: A Route to Produce Self Supported GaN Substrates, Journal of Crystal Growth, North-Holland Publishing Co., Amsterdam, NL, vol. 189/190, Jun. 2, 1998, pp. 97-102, XP000667735.

Yoshiki, K., et al., "Selective Growth of Wurzite GaN and ALXGA1-XN on GaN/Sapphire Substrates by Metalorganic Vapor Phase Epitaxy", Journal of Crystal Growth, North-Holland Publishing Co. Amsterdam, NL, vol. 144, No. 3/4, Dec. 2, 1994, pp. 133-140, XP000483655.

Usui, A "Growth of Thick GaN Layers by Hydride Vapor-Phase Epitaxy", Electronics & Communications in Japan, Part II—Electronics, Scripta Technica. New York, US, vol. 81, No. 7, Jul. 1998, pp. 57-63, XP000835031.

* cited by examiner

Fig. 1 (a)　　　　Prior Art
Decrement of dislocations by a pit made by facets
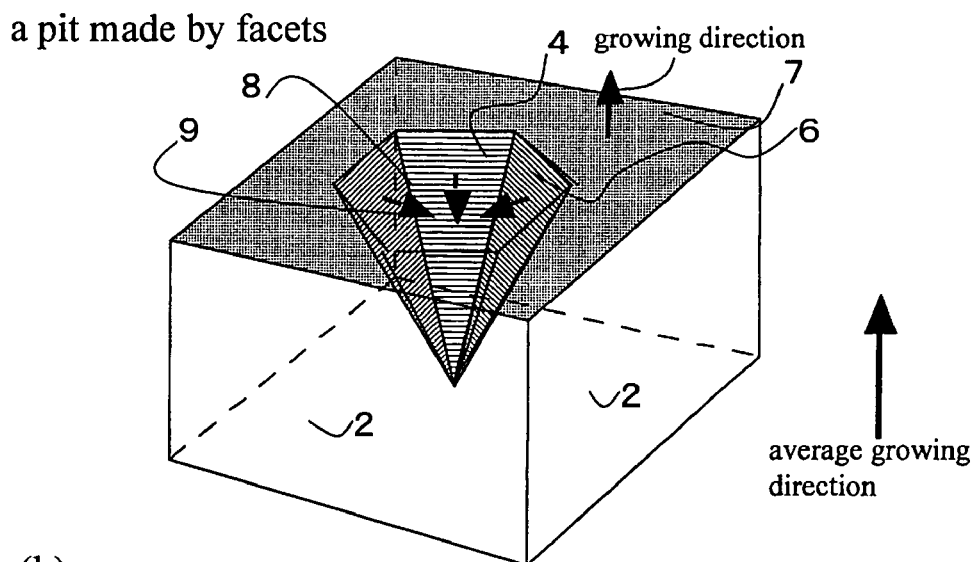
Fig. 1 (b)
after continual growth
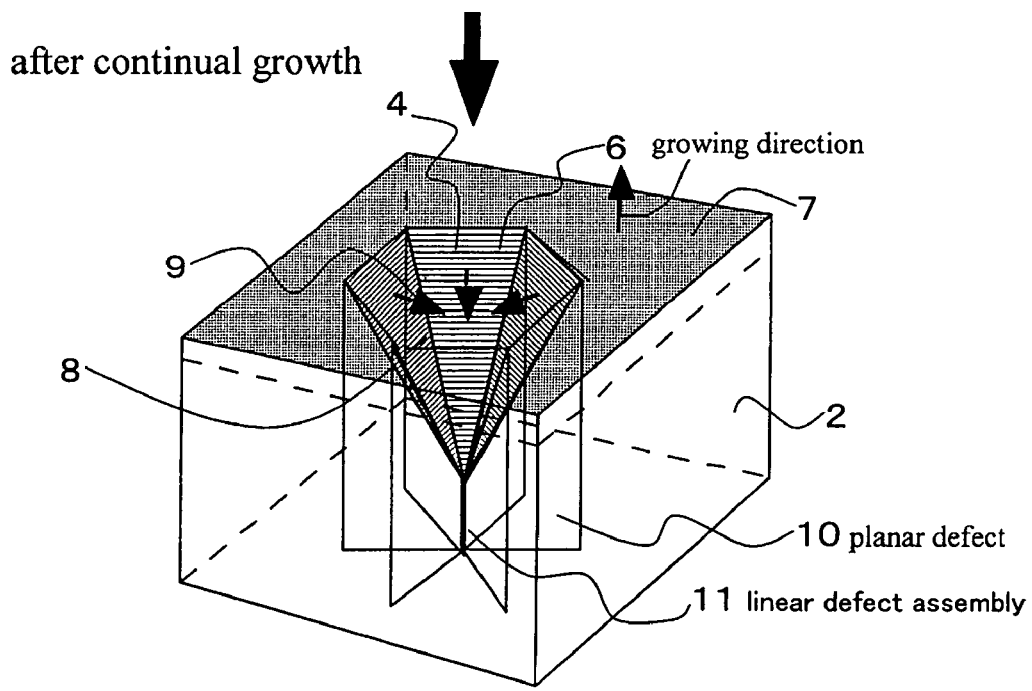

Movements of dislocations inside a pit made by facets

Fig. 3 (1)
Prior Art
Facet growth
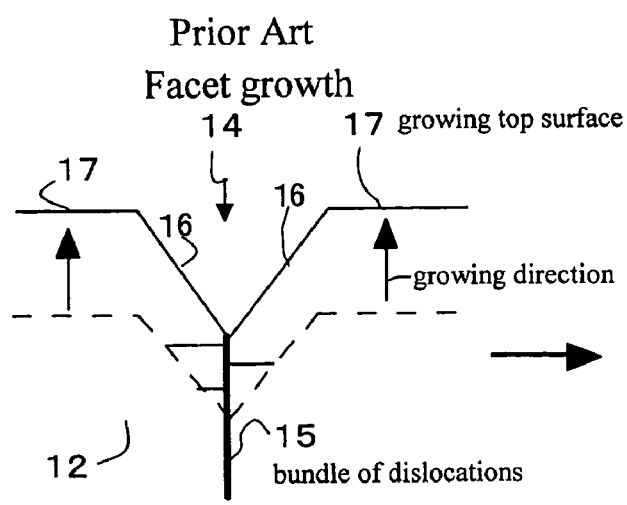
Fig. 3 (2)
Prior Art
Facet growth
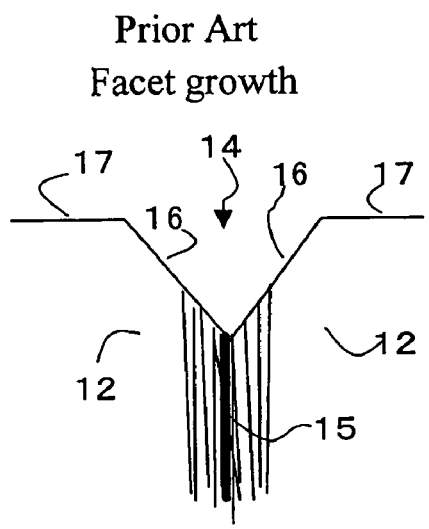
Fig. 4 (1)
Growing method of
the present invention
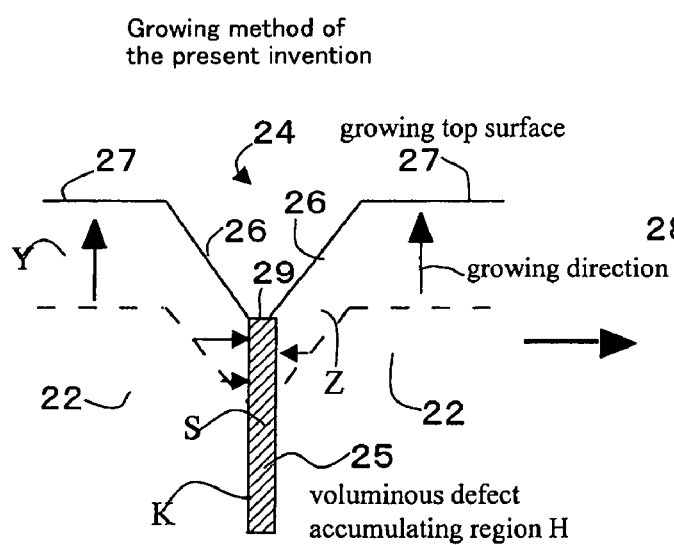
Fig. 4 (2)
Growing method of
the present invention
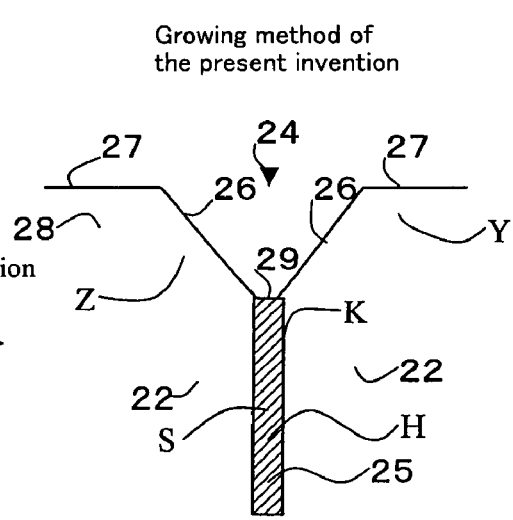

Fig. 5 (a) Relation between mask and voluminous defect accumulating region H in the present invention
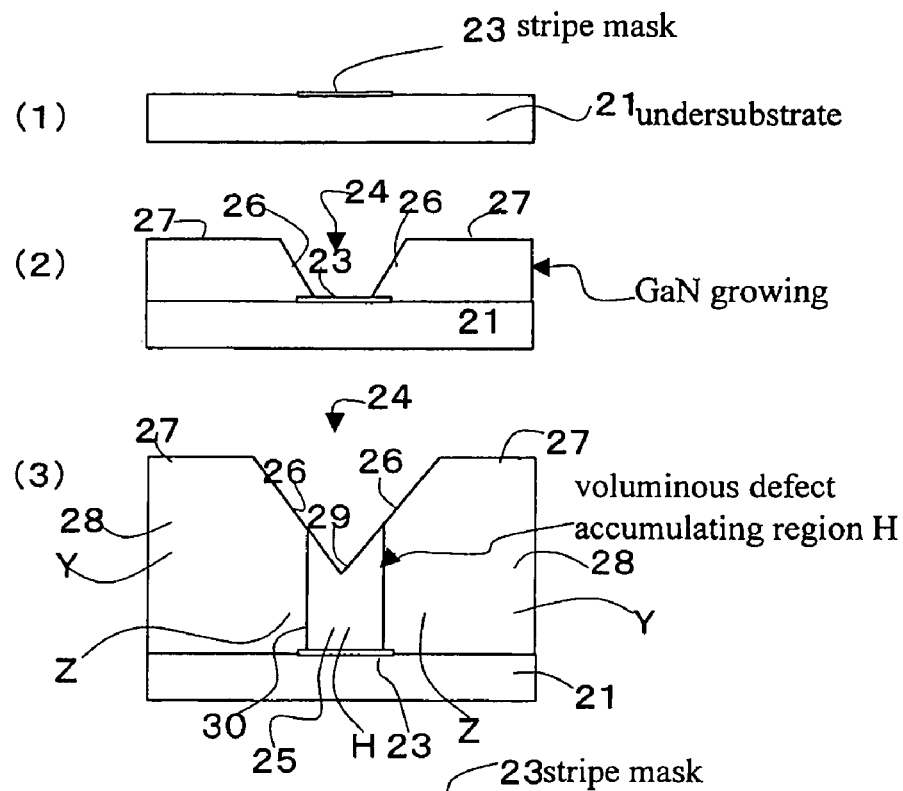
Fig. 5 (b)
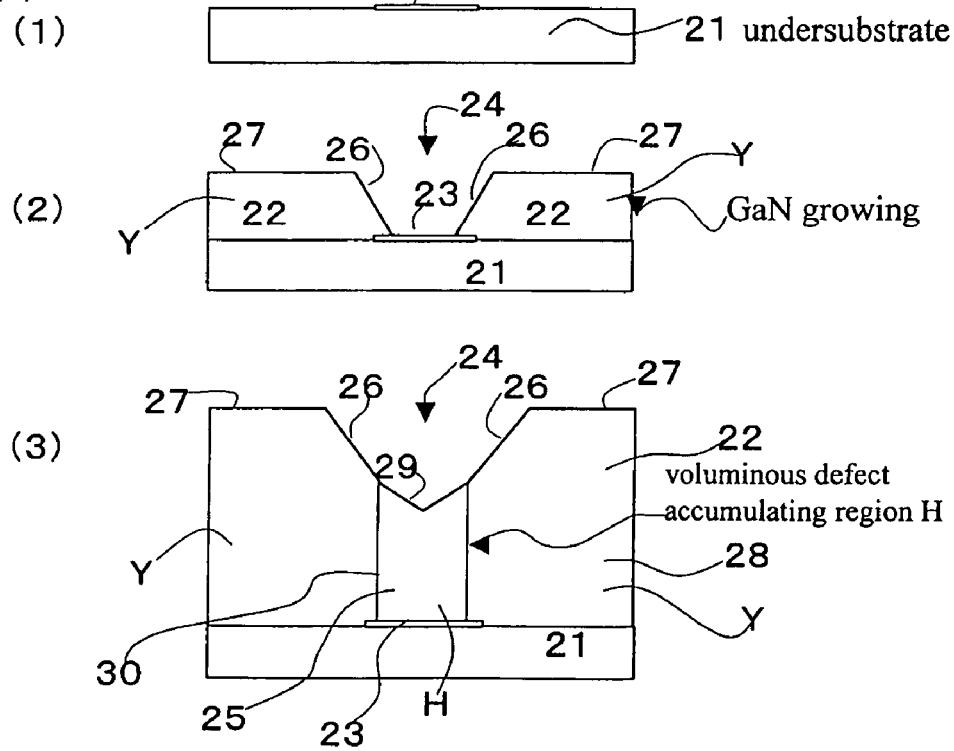

Fig. 6(a) Relation between mask and voluminous defect accumulating region H in the present invention
arrangement of mask
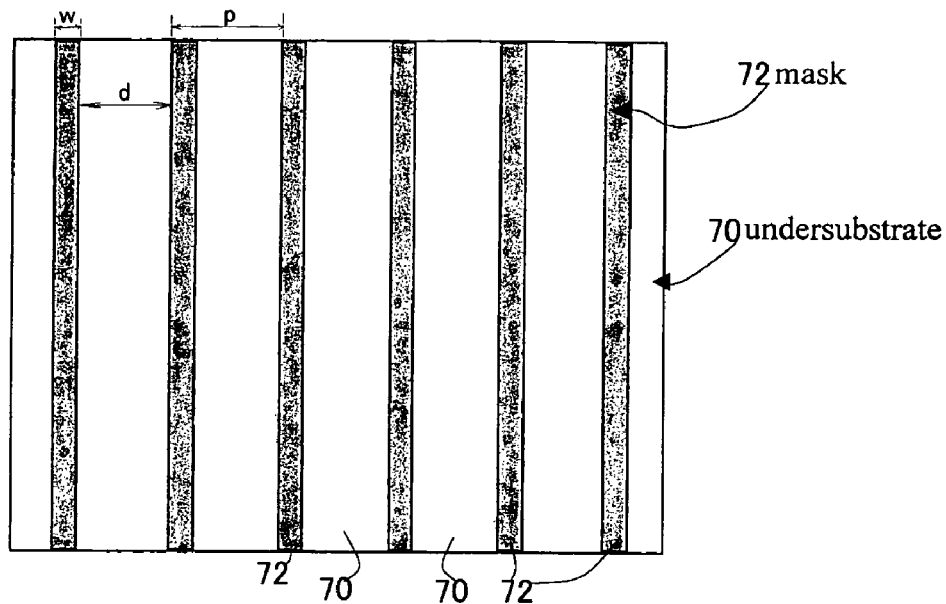
Fig. 6(b) after growing thick GaN
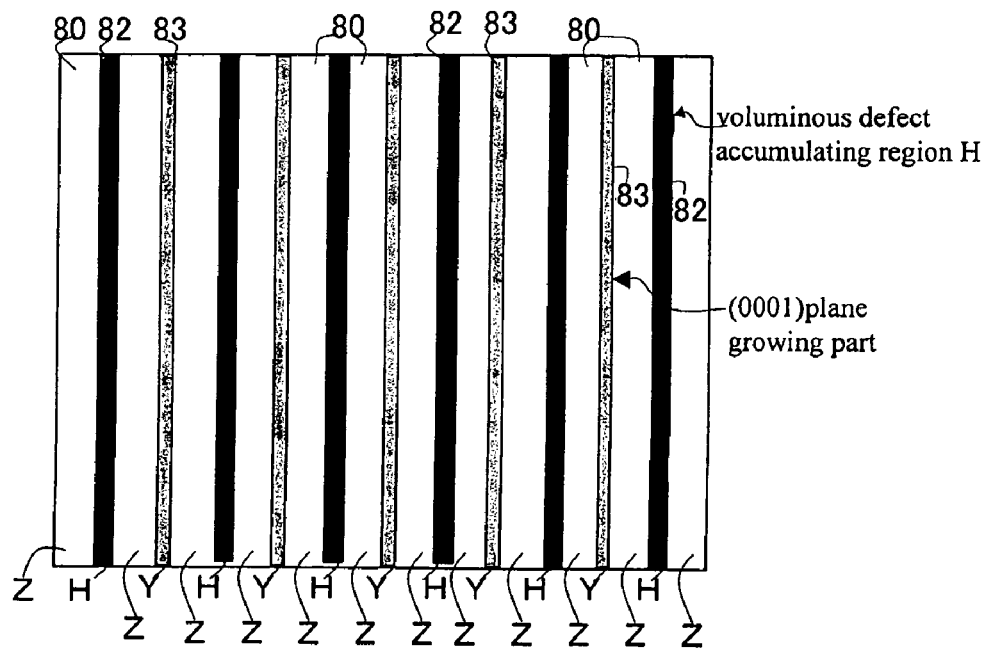

GaN substrate of the present invention (Z) region

360nm/560nm ratio
of photoluminescence power

1750/90=19.4

Fig. 14   Width change of H, Z, Y regions
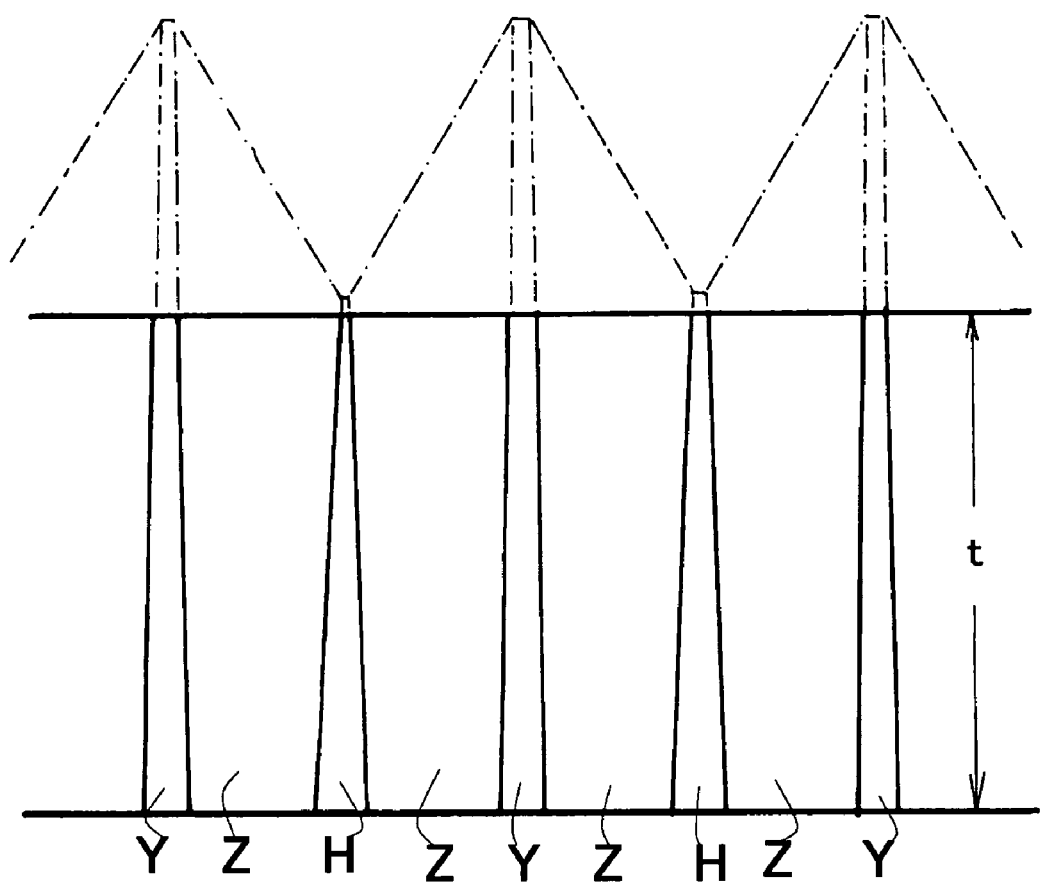

METHOD OF GROWING GAN CRYSTAL, METHOD OF PRODUCING SINGLE CRYSTAL GAN SUBSTRATE, AND SINGLE CRYSTAL GAN SUBSTRATE

BACKGROUND OF THE INVENTION

1. Field of the Invention

This invention relates to a method of producing a single crystal gallium nitride (GaN) substrate and a single crystal GaN substrate utilized as a substrate of making laser diodes (LDs) and light emitting diodes (LEDs) composed of groups 3-5 nitride semiconductors.

2. Description of Related Art

Light emitting devices based upon group 3-5 nitride semiconductor include blue/green light emitting diodes and blue light laser diodes. Blue light LEDs have been sold on the market. But, LDs have not been on the market yet. Almost all of the conventional 3-5 nitride light emitting devices and laser diodes (LEDs, LDs) have been fabricated upon sapphire ($\alpha$-$Al_2O_3$) substrates. Sapphire is a rigid and sturdy material. Sapphire excels in chemical and physical stability. Another advantage of sapphire is to allow GaN heteroepitaxial growth on it. Thus, GaN films, AlGaN films or InGaN films can be grown on sapphire substrates. Sapphire has been an exclusive, pertinent substrate for GaN type LEDs.

Sapphire, however, has some drawbacks as a substrate. Sapphire lacks cleavage. Sapphire is not a semiconductor but an insulator. GaN films or InGaN films grown on a sapphire substrate are annoyed by large lattice misfitting. Lattice misfitting means a difference of lattice constants between a substrate and a film. Sapphire belongs to trigonal symmetry group. Sapphire lacks three-fold rotation symmetry and inversion symmetry. Poor symmetry deprives sapphire of cleavage planes.

The use of sapphire substrates forces device makers to cut a processed GaN wafer into individual chips by mechanical dicing instead of natural cleavage. To dice a hard, sturdy, rigid sapphire plate mechanically into pieces is a difficult process, which decreases yield and enhances cost.

Noncleavage further induces a serious difficulty of making good resonator mirrors of laser diodes. The resonators are made by mechanical polishing, which raises the cost of LDs and declines the quality of the resonators.

Insulation is another weak point of sapphire. Insulating sapphire incurs a difficulty of n-electrodes. An insulating substrate forbids an LED from having an n-electrode on the bottom unlike an ordinary diode. An n-electrode is formed by etching away a top p-GaN layer, an active layer, revealing an intermediate n-GaN film on the sapphire substrate, depositing an n-metal electrode on the n-GaN film, and wirebonding the n-metal electrode with a lead pin. The etching for revealing the intermediate film and wirebonding are extra steps which are required for making an n-electrode on the on-sapphire device.

Current flows in a horizontal direction in the n-GaN film. The n-GaN film should be grown to a thick film for reducing electric resistivity of the n-GaN film. Extra steps and extra components raise the cost of fabrication.

Since two electrodes are formed on n- and p-films within a chip, an extra wide area is required for the chip. The wide, large chip raises cost up.

The third weak point of a sapphire substrate is lattice misfitting. Lattice misfitting induces high density dislocations into GaN epi-layers grown upon a sapphire substrate. It is said that GaN epi-layers of on-sapphire LEDs sold on the market should have $1 \times 10^9$ cm$^{-2}$ dislocations.

Another candidate for a substrate is silicon carbide SiC, since lattice misfit between SiC and GaN is smaller than the GaN/sapphire misfit. A GaN grown on a SiC substrate turns out to have a similar high dislocation density to the on-sapphire GaN layers. SiC does not surpass sapphire as a substrate.

High dislocation density in GaN, InGaN, AlGaN epi-layers causes no problem in the nitride-type LEDs because of low current density. In the case of LDs having a narrow striped electrode and a narrow emission area, high density current would reproduce dislocations and the increased dislocations would shorten the lifetime of LDs. Non-cleavage, insulator and misfit are three serious drawbacks of sapphire substrates.

The best candidate for an ideal substrate for LDs is a gallium nitride (GaN) single crystal substrate. If a high quality GaN single crystal substrate were obtained, the problem of the lattice misfitting would be solved, because a device would take a GaN/GaN homoepitaxy structure.

A GaN crystal has cleavage planes {1-100}. Cleavability of GaN enables device makers to divide a processed GaN wafer into individual chips along cleavage planes. Cleavage lowers the difficulty and cost of chip separation. Resonator mirrors of LDs can be easily produced by natural cleavage. High quality resonators are formed by the cleavage.

GaN can be doped with n-type dopants or p-type dopants. Doping with an impurity can prepare a conductive GaN substrate. Since a low resistance n-type substrate is made by doping with an n-type dopant, an n-electrode can be formed at a bottom of an n-GaN substrate. Vertical electrode alignment enables an LD and an LED to reduce a chip size, simplify a device structure and curtail the cost.

However, GaN single crystals are not yielded as natural resources. Production of GaN single crystals is difficult. Manufacture of high quality GaN single crystal substrates with a practical size has been impossible till now.

It is said that ultrahigh pressure and ultrahigh temperature would realize production of a tiny GaN crystal grown from a mixture of melt/solid at thermal equilibrium. The ultrahigh pressure method is impractical. A wide GaN substrate cannot be made by the method.

Methods of making GaN substrate crystals by growing a thick GaN crystal on a foreign material substrate in vapor phase and eliminating the foreign material substrate had been proposed. The vapor phase method has been inherently a method for making thin GaN, AlGaN, InGaN films on a sapphire substrate. The vapor phase method was diverted from film piling to substrate production. The inherent vapor phase method is unsuitable for substrate production. Large inner stress and many dislocations appeared in the GaN films made by the vapor phase method. Large inner stress prevented GaN films from growing thick crystals sufficient for substrates. A GaN "substrate" is a final product of the present invention. A substrate of a foreign material, e.g., sapphire or GaAs is a starting base plate for making GaN. Two substrates should not be confused. For discriminating two kinds of substrates, the starting foreign substrate is here named "undersubstrate".

The inventors of the present invention proposed an epitaxial lateral overgrowth method of growing a GaN via a mask on an undersubstrate in vapor phase (①Japanese Patent Application No.9-298300, ②Japanese patent application No.10-9008).

In the concrete, the ELO method proposed by us was a method of preparing a GaAs undersubstrate, producing an SiO$_2$ or SiN film on the GaAs undersubstrate, perforating many small windows regularly and periodically aligning with a short pitch (spatial period), growing a GaN film on the masked GaAs substrate in vapor phase for a long time, and eliminating the GaAs substrate. The ELO alleviates inner stress and dislocations. The preceding ELO method utilized sapphire as an undersubstrate, which may be called an on-sapphire ELO. But, the above ELO method made use of GaAs as an undersubstrate. The method of the present inventors is called here an on-GaAs ELO.

The inventors of the present invention have proposed a method of making a plurality of GaN substrates by homoepitaxially growing a thick GaN crystal upon a GaN substrate obtained by the former mentioned ELO method, making a tall GaN ingot and slicing the tall GaN ingot into a plurality of wafers (③ Japanese Patent Application No.10-102546).

The improved ELO gave a probability for making wide GaN single crystal substrates on a commercial scale.

The ELO made GaN crystals were plagued with high dislocation density. The ELO reduces dislocations at an early stage of the growth. During the long time growth, however, dislocations increase again. Bad quality prohibited the ELO-GaN substrates from being the substrates for producing nitride type laser diodes (InGaN-LDs). Production of high quality (long lifetime) LDs required lower dislocation density GaN substrates.

Mass production of devices requires wide GaN substrates which have low dislocation density and high quality in a wide area.

The inventors of the present invention proposed a method of making low dislocation density GaN substrate (④ Japanese Patent Laying Open No.2001-102307). The present invention is an improvement of the former method ④.

The method proposed by ④ is now called "facet growth" method in short. The method reduces dislocations by forming three-dimensional facets and facet pits of e.g., reverse-hexagonal cones on a growing surface intentionally, maintaining the facets and pits, growing a GaN crystal without burying the pits, gathering dislocations by the facets to the bottom of the pits, and reducing dislocations in other regions except the pit bottoms.

Three-dimensional facet pits are otherwise reverse-dodecagonal cones built by facets. The facets comprise typical {11-22} and {1-101} planes.

The facet growth ④ (Japanese Patent Laying Open No.2001-102307) proposed by the inventors grows a GaN crystal in vapor phase on the condition of making facets and maintains the facets without burying the pits of facets. The facets grow not in the c-axis direction but in a direction normal to the facets. The roles of facets and pits in the facet growth ④ (Japanese Patent Laying Open No.2001-102307) are described with reference to FIG. 1 which shows a small part around a facet pit on a surface of a GaN crystal growing in the facet growth. In practice, many facets and facet pits appear on the surface. A vapor phase epitaxy method (HVPE, MOCVD, MOC or Sublimation) grows a GaN crystal on a substrate in a direction of a c-axis. The growth is a c-axis direction growth but is not a "C-plane growth" which has been prevalent in the conventional GaN growth. Facets grow in directions normal to the facets.

Conventional C-plane growth methods grow a GaN film epitaxially on a substrate by maintaining a smooth C-plane surface. Produced GaN crystals have poor quality of high dislocation density, for example, $10^{10}$ cm$^{-2}$. Our new facet growth method intentionally makes facets and pits, maintains the facets and reduces dislocations by make the best use of the function of facets of gathering dislocations into pit bottoms.

The facet growth produces plenty of reverse hexagonal cone pits 4 on the growing GaN surface. FIG. 1 shows a single one of many pits. Six slanting planes are low index facets 6 of {11-22} or {1-101} planes. A flat top surface 7 outside of the pit 4 is a surface of C-plane growth. In the pit, the facet grows inward in the direction of a normal standing on the facet as shown by inward arrows. Dislocations are swept to corner lines 8 by the growing facet. Dislocations are gathered on the six corner lines 8.

The dislocations swept to the corner lines 8 slide down along the corner lines to the bottom of the pit. In practice, the dislocations do not fall along the corner lines 8. The growth raised the facets, the corner lines and the pit bottoms at a definite speed. Sliding dislocations along the rising corner lines centripetally move inward in horizontal directions. Finally, the dislocations attain to the center of the pit just at the time when the pit bottom rises to the height of the dislocation. Then, dislocations are accumulated at the bottom of the pit. The number of the dislocations on the facets is reduced by the accumulation of dislocations at the bottom.

Proceeding of the facet growth sometimes forms planar defects 10 following the corner lines 8 by storing the swept dislocations at the corner lines. The planar defects are six planes with sixty degree rotation invariance corresponding with the hexagonal symmetry of GaN. The width of the planar defects 10 is equal to the diameter of the pit 4. The six planar defects 10 cross at a vertical extension of the pit bottom. The crossing line forms a linear defect assembly 11 having highly concentrated dislocation. Ideally all the dislocations initially existing in the pit are swept to and are accumulated at the pit bottom. The other parts lose dislocations and become low dislocation density single crystals. This is the dislocation reduction method proposed by ④ (Japanese Patent Laying Open No.2001-102307).

Finally, the majority of dislocations are concentrated to the pit center. The operations of the facets reduce dislocation density in the regions included within the projection of the pits.

There are some problems in the new facet growth method proposed by ④ which makes facet pits at random spots accidentally, maintains the facet pits, grows a GaN crystal without burying the pits, and concentrates dislocations to the bottoms of the facet pits.

Though the facets gather dislocations to the pit bottoms, dislocations are not concentrated fully into a narrow, restricted spot. For example, when 100 μm φ pits are yielded, some pits can concentrate dislocations to a small spot at the bottom of a several micrometer diameter but other pits have about 50 μm φ hazy dislocation dispersion region of medium dislocation density near the bottom.

FIG. 3 demonstrates the occurrence of the hazy dislocation dispersion. FIG. 3(1) shows that a c-axis crystal growth (arrows) moves facets 16 inward, dislocations on the facets are carried by the facets 16 in horizontal directions (shown by horizontal lines) to the pit bottom and the bottom has a linear dislocation bundle 15. But, repulsive forces release once gathered dislocations outward. FIG. 3(2) shows that the once concentrated dislocations 15 are diffusing from the bottom to the facet 16 of a pit 14. Occurrence of hazy dislocation dispersion is a drawback of the facet growth of ④.

If the pit size is enlarged for widening the area of good quality portions, the area of the hazy dislocation dispersion further dilates. The reason is supposed that enlargement of a pit size increases the number of the dislocations gathered at the bottom and the number of the dislocations released from the bundle.

The inventors think that the release of dislocations from the pit centers results from repulsion acting between concentrated dislocations. Unification of pits incurs disorder of dislocations and expansion of the hazy dispersion of dislocations. Excess concentration induces the hazy dislocation dispersion.

The hazy dislocation dispersion has about $2 \times 10^7$ cm$^{-2}$ dislocation density which has dependence to positions. Such a high dislocation density GaN substrate is insufficient for making laser diodes (LDs) of a satisfactory lifetime. A long lifetime of LDs requires to reduce dislocations down to one twentieth (1/20) of the current value ($2 \times 10^7$ cm$^{-2}$), that is, to $1 \times 10^6$ cm$^{-2}$.

Another problem is the existence of planar defects 10 produced under the corner lines of pits as shown in FIG. 1(b). The planar defects are radially arranged with 60 degree rotation symmetry. Facets assemble dislocations at pit corner lines. Without progressing to the center bottom, the assembled dislocations form planar defects 10 by dangling from the corner lines. A planar defect can be considered as an alignment of dislocations in a plane. The planar defects are another problem of the conventional facet growth method. Sometimes a slide of crystal planes occurs on both sides of the planar defect.

Besides the 60 degree rotation symmetric planar defects, 30 degree rotation symmetry planar defects sometimes appear in dodecagonal pits on a growing surface. Planar defects appear as dislocation arrays on the surface of the growing substrate. Planar defects are a serious hindrance to produce long lifetime LDs. Prolongation of LD lifetime requires reduction of the planar defects.

Another problem is distribution of defects. Dislocation reduction of the facet growth method makes use of facet pits accidentally and randomly appearing on a facet growth. Positions of pits are not predetermined. Numbers of appearing pits are also not programmable. Positions, numbers, shapes and sizes of appearing pits are all stochastic, random, accidental variables which are unpredeterminable, unprogrammable, uncontrollable. It is a problem that the positions of pits are uncontrollable.

If a plurality of laser diodes were fabricated upon a GaN substrate having random distributing planar defects, emission stripes of active layers of the laser diodes would accidentally coincide with the defect assemblies which occupy random spots on the GaN substrate. In the case of coincidence of the active layer with the defect bundles, important emission layers are plagued by the defect assemblies. Large current density driving current would invite rapid degeneration on emission stripes from the inherent defects of the laser diodes.

Uncontrollability of the positions of pits would decrease the yield of manufacturing laser diodes on the substrate.

Manufacturing GaN substrates for making laser diodes thereon requires enhancement of yield through controlling the positions of dislocation bundles on the GaN substrates. It is important to control the positions of dislocation bundles not to collide with emission stripes of laser diode chips on the GaN substrates.

Three problems have been described for long lifetime laser diodes.

(1) Reduction of hazy dislocation diffusion from the pit center composed of facets, (2) Extinction of planar defects at the bottoms of the pits composed of facets, (3) Controlling of positions of the pits made of facets.

The present invention aims at overcoming the difficulties of these three problems.

Before fundamental principles of the present invention are described, the three problems are clarified further.

A problem of the previous facet growth maintaining facet pits is a state of an assembly of dislocations. Propagation of dislocations on the facets in the pits sweeps and concentrates many dislocations to the center of the pit. The state of dislocation assemblies is unstable, which is a serious problem.

Repulsive force occurs between two dislocations of the same sign Burgers vectors. The repulsive force tends to release bundles of the once concentrated dislocations by giving the dislocations centrifugal forces. The dislocations diffuse outward by the repulsion. The diffusion yields hazy dispersion of dislocations in the vicinity of the dislocation bundles. The hazy dislocation dispersion is a problem.

The reason of making the hazy dislocation dispersion is not clear enough yet for the inventors. One reason is stress concentration due to the dislocation convergence. A plurality of pits are often coupled into a bigger pit during the growth. Coupling pits disturbs the arrangement of dislocations. Perturbation of the dislocation arrangement is another reason of the hazy dislocation diffusion occurring.

The number of assembled dislocations to the dislocation confluence increases. The increase of dislocations enlarges the hazy dislocation dispersion. Another reason is an increase of dislocations by the coupling of pits.

While dislocations gather to the center of the pits composed of facets, corner lines between neighboring facets yield six planar assemblies of dislocations hanging from the corner line, which lie along 6 radii which coincide with each other by 60 degree rotation. The planar defects hanging on the corner lines are generated by the facets sweeping dislocations to the six corner lines of hexagonal pits.

When the unification of pits enlarges a pit size, the number of the dislocations centripetally converging to the center increases, which enhances further the size of the planar defects. This is another drawback of the previous facet growth.

The positions of pit appearing are random, stochastic and accidental matters. Pits appear at random spots by chance. The positions of the facet pits are uncontrollable, stochastic and random.

When optoelectronic devices are produced upon a GaN substrate with the wide hazy dislocation dispersion, random dislocation assemblies fluctuate qualities of the devices, which decreases the yield of the device production.

Next, the fourth problem is, (4) Occurring of microcracks at interfaces between the voluminous defect accumulating regions (H) and the low dislocation single crystal regions (Z) due to difference of thermal expansion.

The voluminous defect accumulating regions (H) take various crystal structures. Polycrystalline voluminous defect accumulating region (H) induces microcracks at the interfaces. The microcracks are caused by random difference of thermal expansion in a polycrystal. Thus, polycrystalline voluminous defect accumulating region (H) is not best.

Single crystal voluminous defect accumulating region (H) with slanting axes or slantingly inverse axes also incurs microcracks at the interfaces. The reason why the microcracks occur is also thermal expansion anisotropy different from the other single crystal parts.

Further, the fifth problem is, (5) Difficulty of stably producing single crystal regions with inversed orientations in GaN wafers at low cost.

Properties of the voluminous defect accumulating region (H) depend upon accidents. It is difficult to always form orientation-inverse voluminous defect accumulating regions (H) on masked undersubstrates. For example, in the case of forming an $SiO_2$ mask on a sapphire undersubstrate, sometimes polycrystalline voluminous defect accumulating region (H) grows on the mask. The other times slanting orientation single crystal voluminous defect accumulating region (H) grows on the mask. Once formed voluminous defect accumulating region (H) disappears halfway. Sometimes voluminous defect accumulating regions (H) of orientation-inverse single crystals mixed with polycrystals are born on the mask.

SUMMARY OF THE INVENTION

Instead of a random narrow confluence following a pit, this invention intentionally makes regularly aligning defect assemblies as a dislocation annihilation/accumulation place. The present invention prepares dislocation annihilation/accumulation places by giving defect assemblies ruled by making defect assemblies at designed spots in a growing crystal.

The previous facet growth transports and converges dislocations by maintaining facets leading slopes. The function of conveying facets is not restricted in pit-shaped facets. Slopes of facets are important for sweeping dislocations. Shapes of a set of facets are less important. The inventors hit upon an idea of employing a linear set of facet strips instead of isolated conical facet pits.

The present invention makes a rack-shaped faceted surface having a number of linear valleys and hills aligning in parallel at a definite pitch, which looks like a series of triangle columnar prisms lying side by side.

FIG. 4, which is a section of a V-groove composed of facets, briefly demonstrates methods of the present invention. The same section continues in the direction vertical to the figure in FIG. 4. FIG. 3 is a section of a conical pit of the previous facet growth method. An undersubstrate (not shown in the figures) allows a GaN crystal 22 to grow with facets 26 in a facet growth mode. A pair of complementarily inclining facets 26 and 26 forms a V-groove 24. Following the bottoms (valleys) 29 of the V-grooves 24, voluminous defect accumulating regions (H) grow upward. Low dislocation single crystal regions (Z) grow under slopes of the facets 26. There are flat tops 27 outside of the facet grooves 24. The flat top 27 is a (0001) C-plane. C-plane growth regions (Y) grow under the flat C-planes 27. The valleys 29 lead voluminous defect accumulating regions (H).

A facet 26 leads a low dislocation single crystal region (Z). A flat top 27 leads a C-plane growth region (Y). The C-plane growth regions (Y), which are low dislocation density single crystals, have electric resistance higher than that of the low dislocation single crystal regions (Z). Growing facets 26 sweep dislocations of the low dislocation single crystal regions (Z) and the C-plane 27 growth regions (Y) inward and converge the dislocations into the voluminous defect accumulating regions (H). Almost all of the dislocations centripetally run in parallel to the C-plane toward the voluminous defect accumulating regions (H). A part of dislocations couple and extinguish. The rest of the dislocations are arrested and accumulated in the voluminous defect accumulating regions (H). A voluminous defect accumulating region (H) consists of an inner core (S) and an interface (K). The dislocation annihilation/accumulation place is either a sole interface (K) or a set of an interface (K) and a core (S). The interface (K) or the core (S) never allows once-captivated dislocations to escape therefrom.

Unlike a narrow defect assembly 15 as shown in FIG. 3(1), the present invention prepares wide voluminous defect accumulating regions (H) and storing dislocations by the voluminous defect accumulating regions (H) with a definite thickness. Wideness and voluminousness enable the voluminous defect accumulating regions (H) to accommodate far more dislocations than the lean defect assembly 15 of FIG. 3(1). One advantage of the present invention is the vast capacity of the voluminous defect accumulating regions (H).

Instead of polygonal pits, the present invention employs linear facets aligning as wide strips extending in a definite direction. Six radial corner lines, which accompany polygonal pits, do not occur on a surface composed of the linear facets. The linear facets would not make radial planar defects. The present invention can avoid the difficulty of occurrence of planar defects, which is a drawback of the previous facet growth, by adopting linear facets.

It is confirmed that linear facet slopes enable linear polycrystalline regions with grain boundaries (K) to occur at the bottoms of the facets and the grain boundaries (K) to act as a dislocation annihilation/accumulation place.

The dislocation annihilation/accumulation places allow the present invention to eliminate the hazy dislocation diffusion from the confluence. The dislocation annihilation/accumulation places clear stagnating dislocations away from the narrow confluence. The dislocation annihilation/accumulation places also kill radial planar defects 10 as shown in FIG. 1(b).

Voluminous defect accumulating regions (H) have a large volume with a definite width h. The large volume ensures large capacity of storing dislocations.

The dislocation annihilation/accumulation regions have a definite width h instead of an indefinitely thin regions (=planes). The definite thickness and volume of the annihilation/accumulation regions (H) have advantages over conventional ELO methods. A conventional epitaxial lateral overgrowth method (ELO) utilizing a similar stripe structure forms small facets, gathers dislocations by the facets to bisecting planes between neighboring windows, and stores the dislocations at the bisecting planes which become planar defects. The planar defects made by the conventional ELO have neither a sufficient thickness nor an enough volume, since the thickness of the planes is indefinitely small. Excess concentration of dislocations enhances the repulsion among dislocations, releases the dislocations and allows the dislocations to diffuse outward.

On the contrary, the present invention can produce the voluminous defect accumulating region (H) having a sufficient, definite thickness. The definite thickness produces two interfaces on both sides. Dislocations attracted from a left side are arrested and stored on a left side interface $K_1$. Dislocations attracted from a right side are gathered and accommodated on a right side interface $K_2$. Dislocations are divided into halves. The number of the dislocations accumulated on an interface is reduced to a half. The division weakens mutual repulsion among converged dislocations.

The voluminous defect accumulating region (H) is a region having a definite thickness. Inner cores (S) can also accommodate dislocations. The dislocation density per unit volume is reduced by additional accumulation in the cores (S). Lower dislocation density in the voluminous defect accumulating regions (H) prevents dislocations from relaxing and escaping.

The conventional ELO method relies upon C-plane growth which maintains a smooth C-plane surface without facets. The dislocations once assembled into the planar defects (bisecting planes) are not constricted and begin to disentangle themselves from the planar defects. Diffusion of the dislocations proceeds during the growth. Dislocations disperse uniformly in the growing GaN crystal. An average dislocation density is about $10^7$ cm$^{-2}$ in the GaN crystal obtained by the conventional ELO. The GaN crystal of such a $10^7$ cm$^{-2}$ high dislocation density is entirely useless for a substrate for making InGaN laser diodes.

This invention succeeds in avoiding burying of facet slopes, in maintaining the facet slopes by forming voluminous defect accumulating regions (H) of a definite thickness, and in captivating dislocations in the voluminous defect accumulating regions (H).

This is a feature of the present invention. What enables the regions (H) to encapsulate dislocations is either polycrystalline voluminous defect accumulating regions (H) or single crystalline voluminous defect accumulating regions (H) having shallow facets on the top.

The defect accumulating regions (H) should have a definite width for permanently arresting dislocations. The "definite width" is signified by a word "voluminous". Thus, the accumulating regions are called "voluminous" defect accumulating regions (H). The gist of the present invention is to decrease dislocations by growing GaN with voluminous defect accumulating regions (H). The width of the voluminous defect accumulating regions (H) is 1 μm to 200 μm.

The voluminous defect accumulating regions (H) and the low dislocation single crystal regions (Z) occur, satisfying a complementary relation. Controlling positions and sizes of voluminous defect accumulating regions (H) occurring determines positions and sizes of the low dislocation single crystal regions (Z). The positions and sizes of voluminous defect accumulating regions (H) can be predetermined by implanting mask as a seed of growing voluminous defect accumulating regions (H) at an early stage of growth. The seed makes a voluminous defect accumulating region (H) thereupon. A set of facets having slopes is made in the neighborhood of the voluminous defect accumulating regions (H). The facets induce formation of low dislocation single crystal regions (Z) following the facets. Thus, implantation of the seed mask can control the sizes and positions of the low dislocation single crystal regions (Z) via formation of voluminous defect accumulating regions (H).

Motivation of making facet valleys leading voluminous defect accumulating regions (H) depends upon the kinds of the voluminous defect accumulating regions (H). A common motivation is the stripe mask which produces cavities upon the stripes by delaying growth. Growing speed on the mask stripes is lower than the speed on the undersubstrate. The delay of forming surfaces is a reason of making cavities upon the stripes. The cavities stabilize forming and maintaining facet valleys following the stripes.

The voluminous defect accumulating regions (H) has a tendency of inviting occurrence of milder inclining facets thereupon. The milder (shallower) facets form stable valleys made of facets (FIG. 5(b)).

Positions of the valleys are determined. The state having valleys of facets is stable. The valleys are not buried but maintained. Controlling positions of facets is realized by this process. Therefore, positions of low dislocation single crystal regions (Z) and defect accumulating regions (H) are determined and controllable. The low dislocation single crystal regions (Z) and the defect accumulating regions (H) can be regularly arranged. This is one of the important points in this invention.

A conspicuous feature (FIG. 5(b)) is occurrence of polarity-inversion of single crystal voluminous defect accumulating regions (H). The polarity (direction of c-axis) of the voluminous defect accumulating regions (H) is different by 180 degrees from the c-axis of the other low dislocation single crystal regions (Z) and C-plane growth regions (Y). In the inversion case, clear grain boundaries happen at the interfaces between the voluminous defect accumulating regions (H) and the low dislocation single crystal regions (Z). The interface grain boundaries play an active role of accumulating the dislocations swept and gathered by the growing facets. In particular in the case of the polarity-inversion occurring in the voluminous defect accumulating regions (H), controlling of the facet growth can be successfully achieved. The reason is that the region of the polarity-inversion grows more slowly than other regions, the inventors suppose.

The above is the basic principle basing the present invention.

The present invention allows a GaN crystal to solve five mentioned serious problems; the hazy dispersion of diffusing dislocations, the planar defects occurring at the dislocation confluence, the difficulty of controlling positions of the dislocation confluence, the occurrence of microcracks caused by the thermal expansion difference, and the stable, low-cost production of the single crystal regions with inversed orientations. The present invention grows a rack-roof GaN crystal having parallel valleys and hills as shown in FIG. 7 and makes a flat, smooth GaN substrate of low dislocation density as shown in FIG. 8. by mechanical processing the rack-roof GaN crystal.

In FIG. 7, a GaN crystal 22 grown on an undersubstrate 21 has a rack-shaped roof of repetitions of parallel hills and valleys which are steep facets. A voluminous defect accumulating region (H) accompanies a valley of the rack-roof in the vertical direction. Slopes forming the hills and valleys are facets 26. What accompanies the facets 26 in the vertical direction are the low dislocation single crystal regions (Z). FIG. 7 shows a GaN crystal having sharp ridges on the hills without flat C-plane growth regions (Y). In this case, the part held between neighboring voluminous defect accumulating regions (H) is a uniform low dislocation single crystal region (Z). FIG. 8 demonstrates a rectangle wafer made by eliminating the undersubstrate from the as-grown GaN substrate, grinding the rack-roof on the top surface and polishing both surfaces of the ground wafer. The GaN wafer has a HZYZHZYZH . . . structure having regularly, periodically aligning voluminous defect accumulating regions (H), low dislocation single crystal regions (Z) and C-plane growth regions (Y). The shape of the C-plane growth regions (Y) depends upon the growth condition. Sometimes the C-plane growth regions (Y) meander with a fluctuating width.

The present invention succeeds in obtaining a low dislocation density GaN single crystal substrate by making parallel facet V-grooves by the facet growth, producing voluminous defect accumulating regions (H) at the valleys, depriving other parts of dislocations by the facets, gathering dislocations to the voluminous defect accumulating regions (H) at the valleys (bottoms) of the V-grooves and annihilating/accumulating the dislocations in the voluminous defect accumulating regions (H) permanently. The formation of the voluminous defect accumulating regions (H) enables the present invention to solve all the five problems aforementioned;

(1) to reduce the hazy dislocation diffusion dispersing from the defect assemblies below the valleys of facets;
(2) to extinguish the planar defects formed below the valleys of facets;
(3) to control the positions of the defect assemblies formed under the valleys of the facets;
(4) to suppress the occurrence of microcracks; and
(5) to stably produce the single crystal regions with inversed orientations at low cost.

The present invention can make a low dislocation density GaN single crystal substrate by controlling the positions of the voluminous defect accumulating regions (H). The major portions (Z) and (Y) of the GaN substrate of the present invention are low dislocation density single crystals obtained by concentrating dislocations into narrow, restricted portions aligning regularly and periodically. The GaN substrates are suitable for a low dislocation substrate for fabricating blue, violet light laser diodes.

Single crystal voluminous defect accumulating region (H) with exact inverse axes (precise antiparallel to the other parts) incurs no microcracks at the interfaces. It is because the thermal expansion anisotropy in the voluminous defect accumulating region (H) coincides with the anisotropy of the other parts, since the orientations are exactly inverse. Due to no probability of microcracks, the orientation-inverse is best for the voluminous defect accumulating region (H).

The conditions of making desired orientation-inverse (antiparallel) voluminous defect accumulating regions (H) on the mask have not been known yet.

The inventors have thoroughly investigated the cases in which the orientation-inverse voluminous defect accumulating regions (H) have been formed on the mask. The inventors sought for a way how to build the orientation-inverse single crystal voluminous defect accumulating regions (H) on masks with high probability.

A purpose of the present invention is to provide a method of easily and stably forming orientation reverse (antiparallel) single crystal voluminous defect accumulating regions (H) on the mask.

The inventors examined crystal growth, growth conditions, processes of the growth by optical microscopes, scanning electron microscopes (SEM), transmission electron microscopes (TEM), cathode luminescence, etching anisotropy, fluorescence microscopes, high energy electron diffraction, convergent beam electron diffraction and so on.

The investigation clarified the conditions for making the antiparallel single crystal voluminous defect accumulating region (H) on masks;
(1) The mask should be made of a material which inhibits GaN epitaxial growth.
(2) Edges of the mask can forcibly stop horizontal invasion of the GaN crystal growth over the mask for a long time. GaN hills grow on a non-masked undersubstrate till the hills build high slanting side walls which are in contact with the edges of the mask. The high slanting side walls are {11-22} facets in most cases. Conditions (1) and (2) invite a new following phenomenon.
(3) A plurality of fine protrusions of inverse-orientation crystals appear locally on the high slanting side wall facets, grow and expand slantingly from the facets.
(4) The orientation-inverse protrusions increase in number, grow in size and extend slantingly toward facing, pairing facets over the mask without touching the mask.
(5) Upper surfaces of the orientation-inverse protrusions, which incline at 25 degrees to 35 degrees to a horizontal plane, are low angle {11-2-6} or {11-2-5} facets. The lower surface which incline at 55 degrees to 65 degrees to a horizontal plane, are {11-22} facets which are a perfect inverse of the facing facets. The lower surfaces are not in contact with the mask. Since the protrusions have inverse axes to the other single crystal parts, a fourth negative index means upper planes and a fourth positive index means lower planes.
(6) Facing protrusions extending from the pairing, facing facets meet, couple and unify with each other. Unification forms shallow V-valleys having low angled {11-2-6} or {11-2-5} facets.
(7) Unification of the pairing protrusions produces grain boundaries (K') above middles of the masks. The middle grain boundaries (K') are lattice misfit planes. Inverse-orientation crystals grow further thicker on the shallow V-valleys ({11-2-6} or {11-2-5}) above the masks so long as the fundamental {11-22} facets are maintained on the non-masked parts. The lattice misfit planes (K') also grow upward without disappearing.
(8) Dislocations born in the non-masked parts are swept and assembled by the slanting facets toward the shallow valleys. The swept dislocations are partially annihilated and the rest of the dislocations is accumulated at interfaces (K) between the shallow valleys and the facets and at the lattice misfitting grain boundaries (K').

The inventors confirmed that voluminous defect accumulating regions (H) grown on the mask are all orientation-inversion single crystals. The orientation-inversion single crystals are not abruptly produced at the mask edges but generated halfway on slanting side facets of GaN hills, are grown inward over the mask, are unified and coupled with the facing protrusions. The phenomenon of appearance of the orientation-inversion protrusions on the facets is quite novel.

At an early stage, GaN crystals are grown only on non-masked parts of the undersubstrate. The mask inhibits GaN growth thereupon. Edges of the mask strongly prohibit the on-non-mask grown GaN crystal hills from overrunning the mask. Slanting facets begin to rise at the edges of the masks. The slanting facets inhibit the GaN hills from extending on the mask. The facets are {11-22} planes in most cases. When the facets can prevent the GaN hills from overstepping the mask, plenty of fine GaN polycrystalline grains are isolatedly dispersed upon surfaces of the masks.

At present, the reason why the orientation-inverse protrusions originate from the facets of the GaN hills on the non-masked parts is not clear. The existence of the sparsely populated fine polycrystalline grains on the mask contributes to occurrence of the protrusions floating over the mask. The polycrystalline grains prohibit GaN crystal hills from overstepping the mask under an extra condition of supersaturation of concentration of material gases.

The phenomenon is quite novel. The phenomenon of appearance of protrusions is clearly different from the well-known epitaxial lateral overgrowth (ELO). The difference between the ELO and the present invention lies at a point whether the orientation is reversed or not reversed at the interfaces (mask edges) between the masked parts and the non-masked parts.

The ELO allows GaN crystals to overstep the mask and to make crystals of the same orientation on the mask. Namely, {11-22} facets expand and overrun on the mask, while maintaining the same {11-22} facets. The crystals overrunning on the mask have the same orientation as the GaN hills on the non-masked parts. No orientation-inversion occurs in the epitaxial lateral overgrowth (ELO) at all.

On the contrary, the orientation inversion occurs in the present invention. The present invention assigns the orientation-inversion to the crystals overstepped on the masks by enlarging the protrusions which are inherently orientation-reversed. The existence of fine polycrystalline GaN particles not only prevents GaN crystals from invading on the mask but also plays an important role of reversing orientations on the mask.

Low temperature buffer layer growth at an early stage is effective to prepare the fine polycrystalline grains on the mask. Low-temperature made buffer layers are built by fine isolated particles.

In many cases, growth stopping facets are {11-22} facets. In addition to the {11-22} facets, {1-101} facets are useful as a growth stopping barrier. When another stripe mask extending in a <11-20> direction is otherwise made on an undersubstrate, {1-101} facets appear on slanting edges. The {1-101} facets have the same barrier function as the {11-22} facets.

The present invention proposes a method of producing a single crystal GaN substrate comprising the steps of:

preparing an undersubstrate;

forming a striped mask pattern made of a material inhibiting GaN from growing partially on the undersubstrate;

forming parallel stripe-masked parts which are parts of the undersubstrate covered with mask stripes of the striped mask pattern and parallel non-masked parts which are parts of the undersubstrate not covered with the mask stripes;

epitaxially growing the GaN crystal on the non-masked parts of the undersubstrate but not growing the GaN crystal on the stripe-masked parts of the undersubstrate at the beginning of GaN growth;

forming a plurality of linearly extending parallel GaN facet hills having facets slantingly extending from edges of the stripe-masked parts to the non-masked parts;

forming protrusions of GaN crystals which have reversed orientation different from that of the GaN crystal on the non-masked parts by 180 degrees and project slantingly from the slanting facets;

extending the protrusions so as not to touch the mask stripes;

unifying the protrusions near an upper middle of the stripe-masked parts;

covering the whole stripe-masked parts with the protrusions;

increasing a thickness of the GaN crystal on the non-masked parts with growing of the protrusions above the stripe-masked parts;

increasing a thickness of the GaN crystal as a whole; and obtaining the GaN crystal having normal-oriented regions formed on the non-masked parts and the reverse-oriented regions formed on the stripe-masked parts.

The present invention also proposes an improved method in which a thin GaN buffer layer is preliminarily formed on the undersubstrate and the stripe mask with a plurality of parallel stripes made of a material inhibiting epitaxial growth on the undersubstrate coated with the GaN buffer layer. The thickness of the GaN buffer layer is 0.5 μm to 3 μm. The pre-coating of the GaN thin film is effective for non-GaN substrates, for example, sapphire and GaAs substrates.

Freestanding GaN substrates obtained by eliminating the undersubstrate by etching or polishing are further polished for making mirror wafers. The top surface is a Ga-plane and the bottom surface is an N-plane except voluminous defect accumulating regions (H).

During the epitaxial growth, growing top surfaces of the C-plane growth regions (Y) are (0001) planes, growing top surfaces of the low dislocation single crystal regions (Z) are {11-22} planes or {1-101} planes, and growing top surfaces of the voluminous defect accumulating regions (H) are {11-2-m} ($m \geq 3$) or {1-10-n}($n \geq 2$) planes. The Y regions grow with C-plane surfaces like ordinary GaN epitaxy. The Z regions grow upward with facetted tops, maintaining the facets ({11-22} or {1-101}). The H regions grow upward with shallow reversed facets unlike the ordinary GaN epitaxy.

The reason why the protrusions originate from the slanting facets is that the early low temperature growth makes many fine GaN polycrystalline granules on the mask and the polycrystalline granules inhibit GaN crystals from overstepping the mask and induce the facets to make protrusions.

Pairs of slantingly extending protrusions meet, touch, couple and unify with each other on middle lines on the mask stripes. Unification of the pairing protrusions yields grain boundaries (K') on the middle lines on the mask stripes. The grain boundaries (K') begin to expand upward by further growth, forming two-dimensional curved planes. The grain boundaries (K') fluctuate right or left on the mask stripes, depending upon growth conditions. Sometimes the grain boundaries (K') deviate from the mask middle lines and coincide with edges of the mask. In this case, it is difficult to find out the grain boundaries in the orientation-inverse regions (H). However, the boundaries again fluctuate in reverse-directions. Extensions of once-vanished boundaries are found at other parts. The middle grain boundaries (K') are finally buried in the reverse-oriented voluminous defect accumulating regions (H) on the mask-stripes.

The grain boundaries (K') are lattice misfit lines in most cases. The unification induces lattice misfit between the pairing protrusions at the boundaries. The misfit lines extend into a misfit curving plane by further crystal growth. But, the misfit via the boundaries is not large. Sometimes no misfit occurs at the boundaries. Difference of the orientations between the orientation-inverse regions neighboring via the middle boundaries (K') is more than 0.01 degree but less than 5 degrees.

The facet-growth sweeps dislocations out of the facetted regions (Z) or the C-plane regions (Y), gathers them into interfaces (K) between H and Z, utilizes the interfaces (K) as dislocation accommodation places, and lowers the dislocation density of the Z and Y regions. A part of the gathered dislocations is annihilated in the interfaces (K) between H and Z. The other part of the gathered dislocations is stored in the interfaces (K). The interfaces (K) and the lattice misfit planes (K') have higher dislocation density than other parts of the voluminous defect accumulating regions (H).

The interfaces (K) which accommodate the gathered dislocations have high dislocation density from $10^6$ cm$^{-2}$ to $10^9$ cm$^{-2}$. The lattice misfitting planes in the voluminous defect accumulating regions (H) have high dislocation density from $10^6$ cm$^{-2}$ to $10^9$ cm$^{-2}$.

The undersubstrate should be any one of a sapphire (Al$_2$O$_3$) single crystal, a silicon (Si) single crystal, a silicon carbide (SiC) single crystal, a magnesium oxide (MgO) single crystal, a zinc oxide (ZnO) single crystal, a gallium arsenide (GaAs) single crystal, an indium phosphide (InP) single crystal, a gallium phosphide (GaP) single crystal, a gallium nitride (GaN) single crystal and an aluminum nitride (AlN) single crystal. The single crystal undersubstrate should have a suitable surface with the same symmetry as GaN crystals. The undersubstrate is sometimes used without precoating. The undersubstrate is sometimes used with pre-coating of a GaN thin film of 0.5 μm to 3 μm thickness.

The stripe mask should have a function of inhibiting GaN epitaxial growth and sustaining roots of the {11-22} facets.

The mask should be made of one of amorphous or polycrystalline silicon oxide (SiO$_2$), silicon nitride (SiN), alumina (Al$_2$O$_3$), aluminum nitride (AlN), zirconium oxide (ZrO$_2$), yttrium oxide (Y$_2$O$_3$) and magnesium oxide (MgO).

The growth-inhibiting mask takes arbitrary repetition of an elementary shape. The present invention takes stripe masks. The stripe mask has a plurality of parallel stripes with a definite width and a definite interval.

The mask stripes have a width w of 5 µm to 100 µm and an interval d of 5 µm to 400 µm. A pitch (spatial period) p is given by p=w+d. An optimum range of the width w is 20 µm to 50 µm. An optimum range of the pitch p is 300 µm to 500 µm, but a pitch range between 100 µm to 1000 µm can be applied.

A preferable example is a GaAs undersubstrate, an SiO$_2$ mask and <11-2> extending stripes. In the example, the undersubstrate is a GaAs (111) single crystal substrate, the material of the mask is SiO$_2$, the stripes of the mask are formed in a <11-2> direction of the (111) GaAs undersubstrate, and the stripes are parallel to a <1-100> direction of GaN crystals grown on the GaAs (111) undersubstrate. In a GaN/GaAs (111) structure, the GaAs <11-2> direction is parallel to GaN<1-100> and a GaAs <1-10> direction is parallel to GaN <11-20GaN <1-100> expanding stripes can make {11-22} facets in contact with edges of the stripes.

In the case of the GaN<1-100> expanding stripes, {11-22} facets are produced on sides of GaN trapezoid crystal hills. Protrusions originate from the {11-22} facets. Bottoms of the protrusions are {11-22} planes. Tops of the protrusions are {11-2-m} (m=3,4,5,6,7,8,9). Top surfaces of the C-plane growth regions (Y) are (0001) planes, top surfaces of the low dislocation single crystal regions (Z) are {11-22} planes and top surfaces of the voluminous defect accumulating regions (H) are {11-2-m} (m=3,4,5,6,7,8,9).

BRIEF DESCRIPTION OF THE DRAWINGS

FIG. 1 is perspective views of a pit composed of facets which have been produced by a facet growth method, which was proposed in the previous Japanese Patent Laying Open No.2001-102307 invented by the inventors of the present invention, for growing a GaN crystal with maintaining facets on a growing surface, and for clarifying that facets grow slantingly inward and gather dislocations to corner lines. FIG. 1(*a*) exhibits that dislocations are swept inward by growing inclining facets and are stored at the bottom of the pit. FIG. 1(*b*) shows that mutual repulsion causes six radial planar defects hanging from the corner lines.

FIG. 3 is vertically sectioned views of a pit for showing that dislocations are swept and gathered to the corner lines by inward growing facets and accumulated at dislocation confluence (manifold point) under the center bottom of the pit and shaped into longitudinally extending bundles of dislocations hanging from the bottom in a facet growth suggested by Japanese Patent Laying Open No.2001-102307 invented by the inventors of the present invention. FIG. 3(1) demonstrates a bundle of dislocations which are formed with dislocations gathered by the facet growth. FIG. 3(2) demonstrates that the dislocation bundle is not closed but open and strong repulsion releases the once gathered dislocations outward into hazy dislocation dispersion.

FIG. 4 is vertically section views of a longitudinal extending V-groove having a valley for showing that dislocations are transferred by inward growing facets and are formed into voluminous defect accumulating regions (H) dangling from the valley of the facets. FIG. 4(1) indicates that the facet growth concentrates dislocations to the voluminous defect accumulating region (H) at the bottom of the valley. FIG. 4(2) shows the voluminous defect accumulating region (H) at the bottom absorb dislocations by the upward growth.

FIG. 5 is sectional views of a sample at various steps for demonstrating the steps of the present invention of making a linearly extending stripe mask on an undersubstrate, growing a GaN crystal on the masked undersubstrate, producing linear facets on the stripe mask, producing voluminous defect accumulating regions (H) under the valleys of the facets, and growing low dislocation single crystal regions (Z) neighboring the voluminous defect accumulating regions (H). FIG. 5(*a*) shows a single facet case having sets of steep slope facets without shallow facets. FIG. 5(*b*) shows a double facet case having sets of steep slope facets followed by sets of shallow facets.

FIG. 6 is CL plan views of a stripe mask and a grown GaN crystal for showing a GaN growth of the present invention. FIG. 6(*a*) shows a CL image of a masked undersubstrate having an undersubstrate and parallel mask stripes. FIG. 6(*b*) shows a CL image of a polished GaN wafer.

FIG. 9(1) denotes a part of a mask stripe deposited upon an undersubstrate. FIG. 9(2) shows parallel hills and parallel vacant spaces on the stripes. FIG. 9(3) shows a set of protrusions is generated from facet surfaces. FIG. 9(4) illustrates the protrusions maintained with reverse orientations and bridged over the stripes. FIG. 9(5) shows that GaN crystal growth continues on the (Y), (Z) regions, a reverse orientation crystal grows on the unified protrusion and a vacant space beneath junction of the protrusions above the mask is filled with GaN granules.

FIG. 14 is a sectional view of a polished GaN substrate showing changes of widths of H, Z and Y in a thickness direction.

DETAILED DESCRIPTION OF THE PREFERRED EMBODIMENTS

Figure 2:
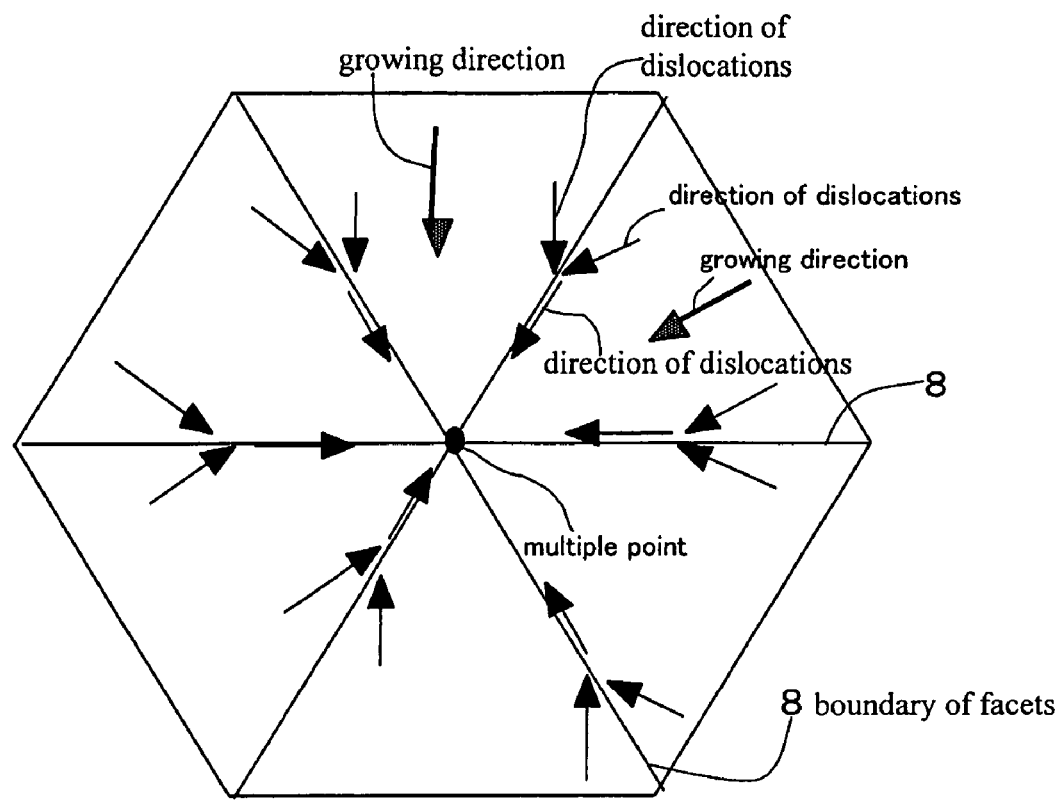
FIG. 2 is a plan view of a pit for showing that dislocations are swept and gathered to corner lines by inward growing facets and accumulated at dislocation confluence (manifold point) under the center bottom of the pit in a facet growth suggested by Japanese Patent Laying Open No.2001-102307 invented by the inventors of the present invention.
Figure 7:
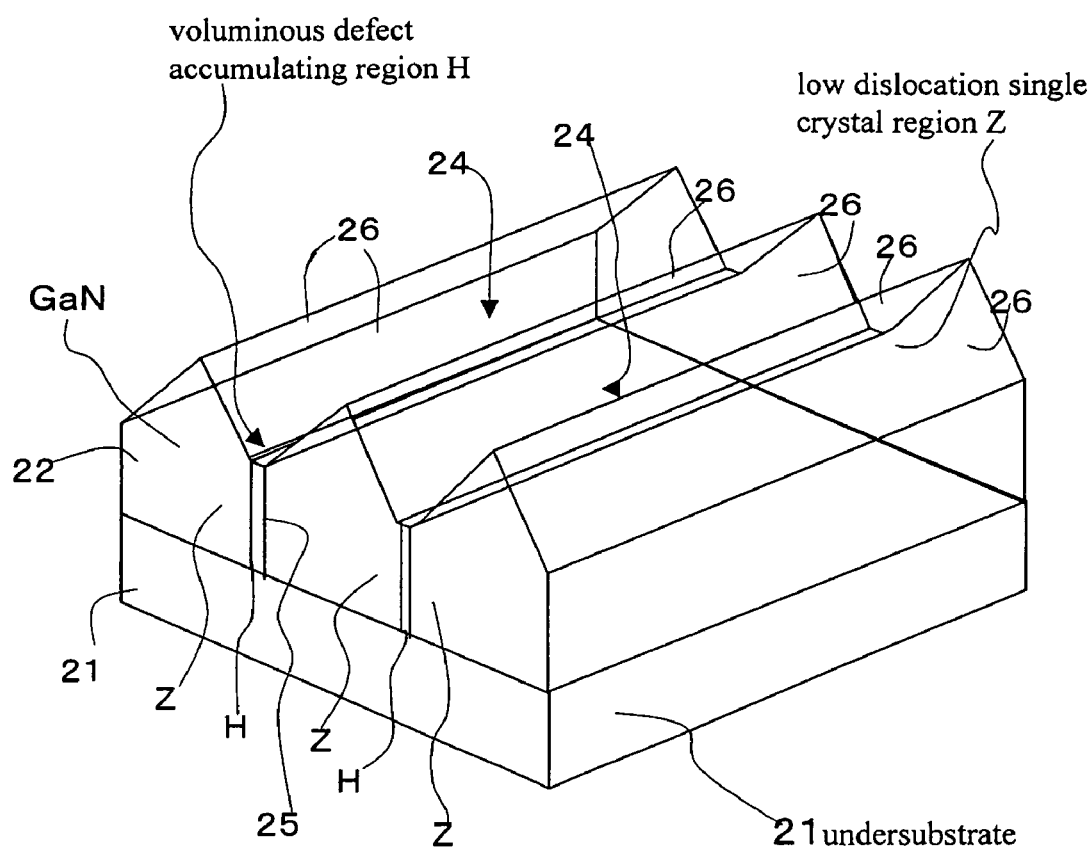
FIG. 7 is an oblique view of a rack-shaped as-grown GaN crystal having a ZHZHZ . . . periodic structure of repetitions of a set of a voluminous defect accumulating region (H) and a low dislocation single crystal region (Z) which are made by forming a stripe mask on an undersubstrate and growing a GaN crystal epitaxially on the masked undersubstrate.
Figure 8:
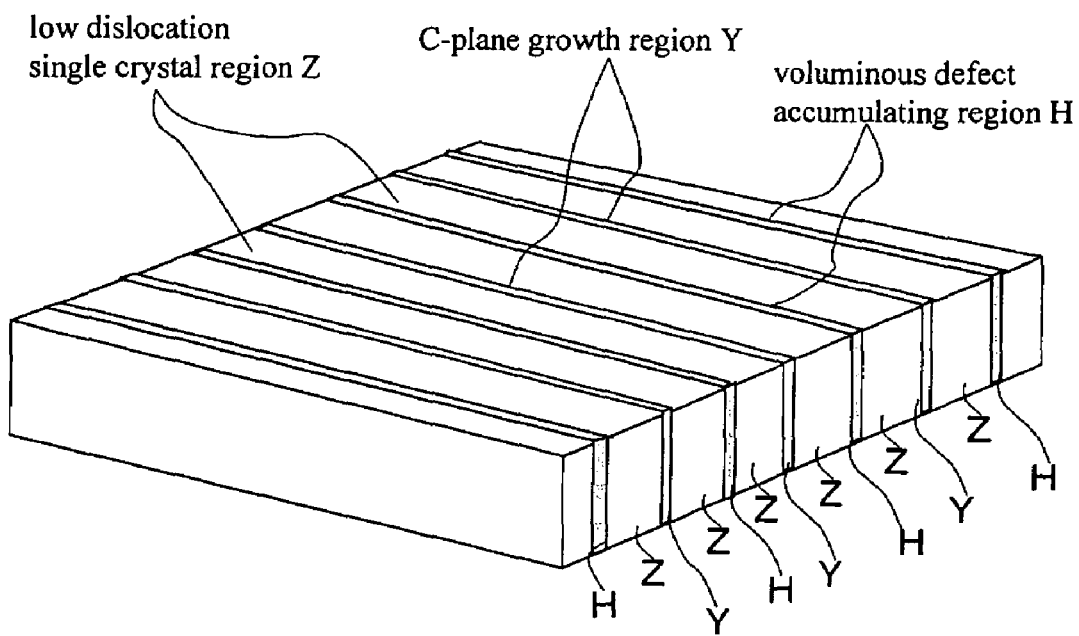
FIG. 8 is a perspective CL view of a mirror polished GaN crystal having a ZHZYZHZYZ . . . periodic structure of repetitions of a set of a voluminous defect accumulating region (H), a low dislocation single crystal region (Z) and a C-plane growth region (Y) which are made by forming a stripe mask on an undersubstrate and growing a GaN crystal epitaxially on the masked undersubstrate.

Embodiment 1 (Stripe Mask Pattern in <1-100>)

1. Growth of GaN Layers on Undersubstrates

[1. Preparation of Undersubstrates]

A plurality of three kinds of undersubstrates S1, S2, S3 are prepared. All the three undersubstrates are circular wafers of a 51 mm (2 inches) diameter.

S1. (0001) sapphire ($Al_2O_3$) wafer (top surface is a C-plane)
S2. (111) GaAs wafer (top surface is a Ga-surface; A-plane)
S3. (0001) GaN/sapphire wafer (1.5 μm GaN+sapphire) which has been made by coating a 51 mmφ sapphire wafer on which a 1.5 μm-thick GaN film has been grown by an MOCVD method.

[2. Formation of Stripe Masks]

Silicon oxide ($SiO_2$) films of a 0.1 μm thickness are deposited by a plasma CVD method on the three kinds of the undersubstrates. Parallel stripes are made by photolithography, which has steps of coating the $SiO_2$/undersubstrates with a resist, exposing the resist via four different stripe patterned photomasks, etching away the exposed parts and obtaining four different striped masks A1, A2, A3, A4 of an assembly of parallel stripes of a definite width w and a definite pitch p (spatial period). An interval d is given by p=w+d.

| | | | |
|---|---|---|---|
| A1; | stripe width w = 5 μm, | pitch p = 300 μm, | interval d = 295 μm |
| A2; | stripe width w = 20 μm, | pitch p = 300 μm, | interval d = 280 μm |
| A3; | stripe width w = 50 μm, | pitch p = 300 μm, | interval d = 250 μm |
| A4; | stripe width w = 200 μm, | pitch p = 500 μm, | interval d = 300 μm |

[3. Formation of Buffer Layers]

GaN films are made upon the masked undersubstrates by an HVPE (hydride vapor phase epitaxy) method which produces GaCl by reaction of HCl gas with over 800° C. melted Ga ($2HCl+Ga \rightarrow 2GaCl+H_2$), guides GaCl downward, and synthesizes GaN by another reaction of GaCl with ammonia gas ($GaCl+NH_3 \rightarrow GaN+HCl+H_2$) and deposits a GaN film on the masked undersubstrate. Carrier gases of HCl and $NH_3$ are hydrogen $H_2$ gas. HVPE growths are carried out twice. The first HVPE growth is a low temperature growth of making a thin buffer layer. The second HVPE growth is a high temperature growth of making a thick epitaxial layer.

(Condition of a Low Temperature Buffer Layer Deposition)

| | |
|---|---|
| Undersubstrates (12 kinds) | S1, S2, S3 × A1, A2, A3, A4 |
| Temperature | 490° C. |
| HCl partial pressure | 0.002 atm (0.266 Pa) |
| $NH_3$ partial pressure | 0.2 atm (26.6 Pa) |
| Growth time | 15 minutes |
| GaN film thickness | 60 nm (buffer layer) |

The first HVPE produces 60 nm buffer layers. Epitaxial layers are further grown upon the buffer layers at a high temperature.

[4. Formation of Epitaxial Layers]

(Condition of High Temperature Epitaxial Layer Deposition)

| | |
|---|---|
| Undersubstrates (12 kinds) | S1, S2, S3 × A1, A2, A3, A4 × buffer |
| Temperature | 1010° C. |
| HCl partial pressure | 0.02 atm (2.66 Pa) |
| $NH_3$ partial pressure | 0.25 atm (33 Pa) |
| Growth time | 15 min, 30 min, 60 min, 600 min |

The specimens are taken out of the furnace, and are examined and estimated of various properties. The 600 min-grown specimens are polished into smooth, flat circular wafers.

(1) Observation of Crystal Growth of Embodiment 1

Samples (S2*A3) which have (111) GaAs undersubstrates (S2) with a 50 μm/300 μm stripe mask are examined by an optical microscope and a scanning electron microscope (SEM).

15 minute grown samples (S2*A3), which have been taken out of the furnace after 15 minute growth, have thick GaN epitaxial linear mesa islands on non-masked parallel parts but no GaN films upon the mask stripes. There are few isolated fine polycrystals on the mask stripes. The thickness of the GaN islands on the non-masked parts is about 25 μm. The mesa (trapezoid) linear islands have {11-22} facets at interfaces between the mask and the non-masked parts. Namely, sides of the trapezoids are {11-22}. The top plateau is a (0001) plane (C-plane).

30 minute grown samples (S2*A3), which have been taken out of the furnace after 30 minute growth, have thicker GaN epitaxial linear trapezoid islands only on the non-masked parallel parts. The thickness has been increased up to 50 μm. But, the masked parts have not continual film but a little tiny isolated polycrystalline islands. Growth of the crystalline GaN growth is rigorously stopped on both sides at the interfaces of the mask stripes. Sides of the GaN are {11-22} facets. Plenty of rugged protrusions, which slantingly extend toward upper vacant spaces above the mask stripes, appear on the side {11-22} facets. Upper facets of the extending protrusions incline at angles of 25 degrees to 35 degrees to a horizontal plane. Lower facets of the extending protrusions are not in contact with the mask but are separated from the mask. The appearance of the slanting protrusions is a new discovery and a new contrivance of the present invention.

60 minute grown samples (S2*A3), which have been taken out of the furnace after 60 minute growth, have about 100 μm thick GaN epitaxial linear trapezoid islands on the non-masked parallel parts. The facets {11-22} on both sides of the striped trapezoid GaN crystals are maintained at the interfaces. The slanting protrusions further grow from the side facets. The protrusions rooted on the side facets are extending. Pairing protrusions extending from the pairing, facing facets meet with each other above middles of the mask stripes and bridge over the mask stripes. Neighboring protrusions on the same side facets are unified in the stripe directions. Unification of the pairing protrusions proceeds in the longitudinal (stripe) direction. Wide rugged bridges, which extend in the longitudinal direction, are formed between neighboring non-mask GaN stripe films over the mask. Upper surfaces of the unified protrusions incline at angles of 25 degrees to 35 degrees to the horizontal lines and form mild V-grooves of bottom obtuse angles of 130 degrees to 110 degrees. The slanting angles (25-35 degrees) of the upper surfaces are smaller than the oblique angle of the side {11-22} facets. Double inclining V-grooves are produced by the side facets and the protrusions. Repetitions of parallel hill/valley appear in the direction vertical to the stripes. Lower surfaces of the protrusions are separated from the mask and have {11-22} planes. There are vacant spaces between the unified protrusions and the mask stripes.

600 minute grown samples (S2*A3), which have been taken out of the furnace after 600 minute growth, have about 1000 μm (=1 mm) thick parallel GaN epitaxial striped hills on the non-masked parallel parts. The structure of the repetition of hill/valley which has appeared in the 60 min samples is maintained. The hill has a high plateau (0001) and slanting facets {11-22} on the sides. Following the {11-22} facets, shallow V-valleys cover the stripes allover. The shallow V-valleys on the mask have grown for 10 hours from the 60 minute grown crystal without changing the V-shape. The hills on the non-masked parts have a section of a trapezoid or triangle with {11-22} facets sides and a top plateau or a line. In the case of the triangle section, no C-plane appears. In the case of trapezoid section, C-plane (0001) parts appear on the top plateau. In any case, no crack appears in the hills on the non-masked parts. The 600 minute grown samples have a rugged top surface built of repetition of hills and valleys and the bottom undersubstrate. The bottom GaAs undersubstrates of the 600 minute grown sample are eliminated by grinding. The top surfaces are also ground into flat surfaces. The top surfaces are further polished into smooth surfaces. Smooth, flat freestanding GaN substrate wafers of a 50 mm diameter are obtained. Optical microscope observation confirmed that there is no crack allover on the GaN wafer.

(2) Estimation of Crystal Properties

Crystal properties of the 600 min facet-grown & polished GaN samples are estimated by various methods.

First, the 600 min grown polished GaN wafers are examined by an electron beam diffraction method. Clear diffraction patterns denote that the GaN wafers are single crystals. There is no difference in electron beam diffraction patterns between the shallow valley parts which have grown on the mask stripes and the other parts grown on the non-masked parts. This means that the shallow valley parts have the same single crystal structure as the other parts grown on the non-masked parts. But, the method cannot discern crystal orientations.

Second, the 600 min grown freestanding GaN wafers are examined by a Convergent Beam Electron Diffraction (CBED). The CBED method clarifies that the shallow valley parts on the mask stripes have a C-axis which is inverted at 180 degrees to a C-axis of the other parts grown on the non-masked parts. The on-mask grown (shallow valley) parts seem to be inverse-orientation regions. The polished freestanding GaN wafers are etched in a hot KOH solution. The surfaces of the on-mask grown (shallow valley) parts are easily etched but the surfaces of the other on-non-mask grown parts are not etched. It is known that a Ga-surface ((0001) surface) of GaN is not etched but a N-surface ((000-1) surface)of GaN is easily etched by hot KOH. Thus, the on-mask grown (shallow valley) parts have not a Ga-surface (0001) but a N-surface (000-1) on the top. The other on-non-mask grown parts have a Ga-surface (0001). The on-mask grown parts are (000-1) single crystals and the on-non-mask grown parts are (0001) single crystals.

The CBED and the KOH etching teach us that the rugged protrusions rooted on the slanting {11-22} facets are inherently inverse-orientation crystals, the shallow V-grooves initiated by and piled on the protrusions are also inverse-orientation crystals and all the on-mask parts are inverse-orientation (000-1) crystals having 180 degree inverted C-axes. The other parts are normal C-plane surface (0001) crystals. A novel growth mechanism clarifies that developments of the inverse-orientation protrusions make inverse-orientation crystals allover on the mask stripes.

Estimation of the facet-grown GaN crystals is further done by a cathode luminescence method and fluorescence microscope observation.

The freestanding polished GaN wafers are substrates in which most of top surfaces are a (0001) C-plane and parts on the masks are a -C-plane (000-1). The polished GaN wafers are flat and transparent. The cathode luminescence method which selects about 360 nm as a measuring wavelength can clarify histories of growth by differences of contrast of luminescence. The on-mask grown parallel parts are observed in an CL image as dark parallel lines which are regularly spaced with a pitch of 300 μm. The 300 μm pitch is equal to the mask stripe pitch of 300 μm of the mask A3. FIG. 6(a) is a plan view of a masked undersubstrate having an undersubstrate 70 and parallel mask stripes 72. FIG. 6(b) is a plan view of a CL image of the polished GaN wafer.

Dark luminescent parallel parts 82 in FIG. 6(b) coincide with the mask stripes 72 in FIG. 6(a). Facet-grown parts 80 neighboring to the on-mask grown parts 82 appear as light contrast in the CL image. Semi-dark CL contrast parts 83 are seen in the middles of the light contrast facet-grown parts 80, 80. The semi-dark CL contrast parts 83 are the C-plane growth parts. In the CL image, {11-22} facet-growth parts are observed as bright contrast and (0001) C-plane growth parts are observed as semi-dark contrast in general.

The on-mask grown parts are more in detail observed by the CL images. The orientation-inversion regions on the mask stripes have interfaces which are grain boundaries. The grain boundaries are seen as sharp dark lines at the mask interfaces in the CL pictures. At the middles of the on-mask grown parts, the dark lines, which correspond to the grain boundaries, appear. The grain boundaries are induced by the unification of two sets of protrusions extending from pairing facets at the middles of the mask stripes.

The unification boundaries correspond to the bottoms of the shallow V-valleys on the mask stripes.

Thickness of the GaN crystal and other conditions vary positions of the unification boundaries. The unification boundary lines run mostly at the middles of the mask stripes in the 60 min-grown specimens. However, the unification boundary lines sometimes at the middles or the other times near the interfaces of the mask stripes in the 600 min-grown specimens. The grain boundaries do not always lie at just the middles of the mask stripes. This means that the grain boundaries deriving from the unification of the pairing protrusions fluctuate right and left during epitaxial growth.

Instead of the cathode luminescence observation, a fluorescence microscope can clarify and discern the above-described matters, for example, the orientation inversion parts, the facet-grown parts, the C-plane growth parts, the grain boundaries at the interfaces and the grain boundaries at the middles of the mask stripes.

TEM (transmission electron microscope) observation analyzes the grain boundaries within the (on-mask) orientation-inversion parts more in detail. The specimen are cut in a plane including the middle grain boundary. Electron beam diffraction experiments are done on more than twenty points on both sides of the middle grain boundary. Diffraction patterns on the sides of the boundary sometimes coincide.

But, many times the diffraction patterns are discrepant on examination spots reversely-adjacent to the boundary. In the case, the boundary is a lattice misfit plane. Then, the orientations of neighboring grains via the boundary are different. The degree of the orientation difference depends upon samples, stripes and examination spots. The angular discrepancy is less than 5 degrees (0-5 degrees). Then, the middle grain boundaries are lattice misfit planes with small orientation discrepancy.

Since the unification points which are starting points of the middle boundaries do not clearly appear in the thick samples, the specimens in short growth time should be observed. 30 & 60 min grown GaN/GaAs specimens are examined. Rugged protrusions appearing at 30 minute growth have an upper surface and a lower surface which root on side facets {11-22}. The upper surfaces should have {11-2-m} (m≧3) and the lower surfaces should have {11-2n}(n≧2) in general from directional restriction. The upper surface inclines at 25 degrees to 35 degrees to a horizontal plane. The upper surfaces of the protrusions are considered to be {11-2-6} or {11-2-5}. The lower surfaces incline at 55 degrees to 65 degrees to a horizontal plane. The lower surfaces of the protrusions are considered to be {11-22} plane. The orientation is reversed in the protrusions. A downward facet takes a positive fourth Miller index. A protrusion (klmn) plane is the same as an other part (-k-l-m-n) plane. The lower {11-22} surfaces are just inverse planes of the facing {11-22} facets. The lower {11-22} surfaces of the protrusions are perfectly antiparallel to the counterpart facing facet {11-21}. Thus, the orientation of the protrusion can be realized by turning a part of the facing facet around a horizontal axis at 180 degrees. Then, the protrusions are orientation-inverse crystals. The orientation-inverted protrusions expand slantingly from 30 minutes to 60 minutes without touching the mask stripes. At 60 minutes, the pairing protrusions encounter, combine above the mask and bridge the mask. The upper unified surfaces {11-2-6} or {11-2-5} make shallow valleys having milder slopes than the root {11-22} facets. GaN crystals grow further in the reverse-orientation upon the shallow valleys. Then, all the GaN crystals above the mask become an orientation-inverse GaN single crystal. Vacant space just on the mask is filled with GaN inverse crystal grains after the unification.

Dislocation density in the GaN specimens is examined by the cathode luminescence method. Threading dislocations appear as black points in a CL picture. The dislocation density can be obtained by counting the number of black dots in an object area and dividing the number by the area. The dislocation density is measured locally on the polished specimens. It turns out that the on-non-mask grown parts have very low dislocation density of $10^4$ cm$^{-2}$ to $10^5$ cm$^{-2}$ and dislocations are surprisingly reduced in the on-non-mask grown parts. On the contrary, the on-mask grown parts have high dislocation density of $10^6$ cm$^{-2}$ to $10^9$ cm$^{-2}$. It has been well known that a GaN thin film grown on a sapphire substrate has dislocation density of $10^8$ cm$^{-2}$ to $10^9$ cm$^{-2}$. The facet-growth of the present invention succeeds in reducing dislocations by a factor of $10^{-3}$ to $10^{-4}$. Then, the inventors name the on-mask grown ($10^6$ cm$^{-2}$-$10^9$ cm$^{-2}$) parts voluminous defect accumulating regions (H). The on-non-mask facet-grown ($10^4$ cm$^{-2}$-$10^5$ cm$^{-2}$) single crystal part is named a low dislocation single crystal region (Z). The on-non-mask C-plane grown ($10^4$ cm$^{-2}$-$10^5$ cm$^{-2}$) part is named a C-plane growth region (Y). In FIG. 6(b), the bright stripes 80 are Z, the dark stripes (on-mask) 82 are H, and the semi-dark stripes 83 are Y.

(3) Influences Induced By Different Mask Patterns (A1, A2, A3, A4)

| A1; | w = 5 μm, | p = 300 μm, | d = 295 μm |
|---|---|---|---|
| A2; | w = 20 μm, | p = 300 μm, | d = 280 μm |
| A3; | w = 50 μm, | p = 300 μm | d = 250 μm |
| A4; | w = 200 μm, | p = 500 μm, | d = 300 μm |

The above described matters relate to examples of the specimens (S2*A3) having A3 (w=50 μm) masks on GaAs. Similar experiments are done on GaAs undersubstrates having different A1 (w=5 μm), A2 (w=20 μm), and A4 (w=200 μm) masks. Similar results are obtained for the specimens with different types of masks. In the case of the mask A1, the mask stripes are too narrow. The narrow H regions obscure existence of grain boundaries within the orientation-inverse (H) regions. The narrow mask stripes allow voluminous defect accumulating regions (H) to disappear accidentally. The A1 masked specimens, which are not the best example, can obtain the effect of reducing dislocations in the Z regions. A2 (w=20 μm) masked specimens are nearly identical to the described A3 masked specimens. The A2, A3 masked specimens are the best. A4 masked specimens, which have 200 μm wide stripes, exhibit a drawback. Protrusions rooted on the side facets should extend by 100 μm till the protrusions meet and couple at the middle of the stripes. It takes too long time to unify the pairing protrusions. The wide mask delays growth. The wide mask widens the voluminous defect accumulating regions (H) which are of no use of making laser diodes. Too wide voluminous defect accumulating region (H) raises the cost. Thus, desirable width of the mask stripes is 5 μm to 100 μm.

(4) Influences By Different Kinds of Undersubstrates

S1; sapphire undersubstrate
S2; GaAs undersubstrate
S3; 1.5 μm GaN/sapphire undersubstrate The above description relates to the specimens (S2*A3) with a GaAs undersubstrate (S2). Similar experiments are done on S1 (sapphire) and S3 (1.5 μm GaN coated sapphire) undersubstrates. Results on S1 and S3 are identical to S2.

In the S1 case, sapphire single crystal (0001) wafers of 51 mm φ are prepared. An SiO$_2$ film of a 0.1 μm thickness is produced on the sapphire undersubstrates by a plasma CVD method. A1, A2, A3 and A4 stripe masks are formed by photolithography upon the sapphire 51 mmφ undersubstrate. GaN buffer thin layers are grown at a low temperature below 700° C. GaN epitaxial layers are grown on the masked sapphire wafer at a high temperature over 1000° C. Similarly to the S2 (GaAs) case, thick GaN trapezoid hills grow on non-masked parts of the undersubstrate. Sides of the trapezoid hills are {11-22} facets. The side facets prevent GaN crystals from invading upon the mask till the hills reach a definite height. Protrusions appear on the side facets {11-22} on the masked parts and extend inward from the facets. Orientation-inverse crystals begin to grow from the protrusions, forming shallow V-valleys following the {11-22} facets. Delay of the shallow V-valley (on-mask grown) parts sweeps dislocations from the on-non-mask grown parts and accumulates the dislocations into the on-mask shallow V-valleys. Parallel voluminous defect accumulating regions (H) are produced on the mask stripes. Parallel low dislocation single crystal regions (Z) are produced on the non-masked undersubstrate. Parallel C-plane growth regions (Y) appear on the middles of the non-masked undersubstrate.

The low dislocation single crystal regions (Z) have low dislocation density of $10^4$ cm$^{-2}$ to $10^5$ cm$^{-2}$. The C-plane growth regions (Y) have low dislocation density of $10^4$ cm$^{-2}$ to $10^5$ cm$^{-2}$. The voluminous defect accumulating regions (H) have high dislocation density of $10^6$ cm$^{-2}$ to $10^9$ cm$^{-2}$.

In the S3 case, sapphire single crystal (0001) wafers of 51 mm φ are prepared. A 1.5 μm thick GaN film is deposited on the sapphire undersubstrate by the MOCVD method. An SiO$_2$ film of a 0.1 μm thickness is produced on the GaN/sapphire undersubstrates by the plasma CVD method. A1, A2, A3 and A4 stripe masks are formed by photolithography qupon the GaN/sapphire 51 mmφ undersubstrate. GaN buffer thin layers are grown at a low temperature below 700° C. GaN epitaxial layers are grown on the masked GaN/sapphire wafer at a high temperature over 1000° C. Similarly to the S2 (GaAs) case, thick GaN trapezoid hills grow on non-masked parts of the undersubstrate. Sides of the trapezoid hills are {11-22} facets. The side facets prevent GaN crystals from invading upon the mask till the hills reach a definite height. Protrusions appear on the side facets {11-22} on the masked parts and extend inward from the facets. Orientation-inverse crystals begin to grow from the protrusions, forming shallow V-valleys following the {11-22} facets. Delay of the shallow V-valley (on-mask grown) parts sweeps dislocations from the on-non-mask grown parts and accumulates the dislocations into the on-mask shallow V-valleys. Parallel voluminous defect accumulating regions (H) are produced on the mask stripes. Parallel low dislocation single crystal regions (Z) are produced on the non-masked undersubstrate. Parallel C-plane growth regions (Y) appear on the middles of the non-masked undersubstrate. The low dislocation single crystal regions (Z) have low dislocation density of $10^4$ cm$^{-2}$ to $10^5$ cm$^{-2}$. The C-plane growth regions (Y) have low dislocation density of $10^4$ cm$^{-2}$ to $10^5$ cm$^{-2}$. The voluminous defect accumulating regions (H) have high dislocation density of $10^6$ cm$^{-2}$ to $10^9$ cm$^{-2}$.

(5) Influences of Mask Materials

The above embodiments adopt SiO$_2$ as a mask material. The inventors tried other materials for masks. 0.1 μm thick A3 mask (w=50 μm, p=300 μm, d=250 μm) patterns of Si$_3$N$_4$, Al$_2$O$_3$, AlN, ZrO$_2$, Y$_2$O$_3$, and MgO are formed on sapphire undersubstrates. Low temperature growth and high temperature growth are done on the masked sapphire undersubstrates on the same condition as Embodiment 1. It is confirmed that protrusions appear on both facets of GaN trapezoid hills after 30 min epitaxial growth for all the specimens. The above all mask materials are available for the present invention.

Embodiment 2 (Observation Results)

Figure 9:
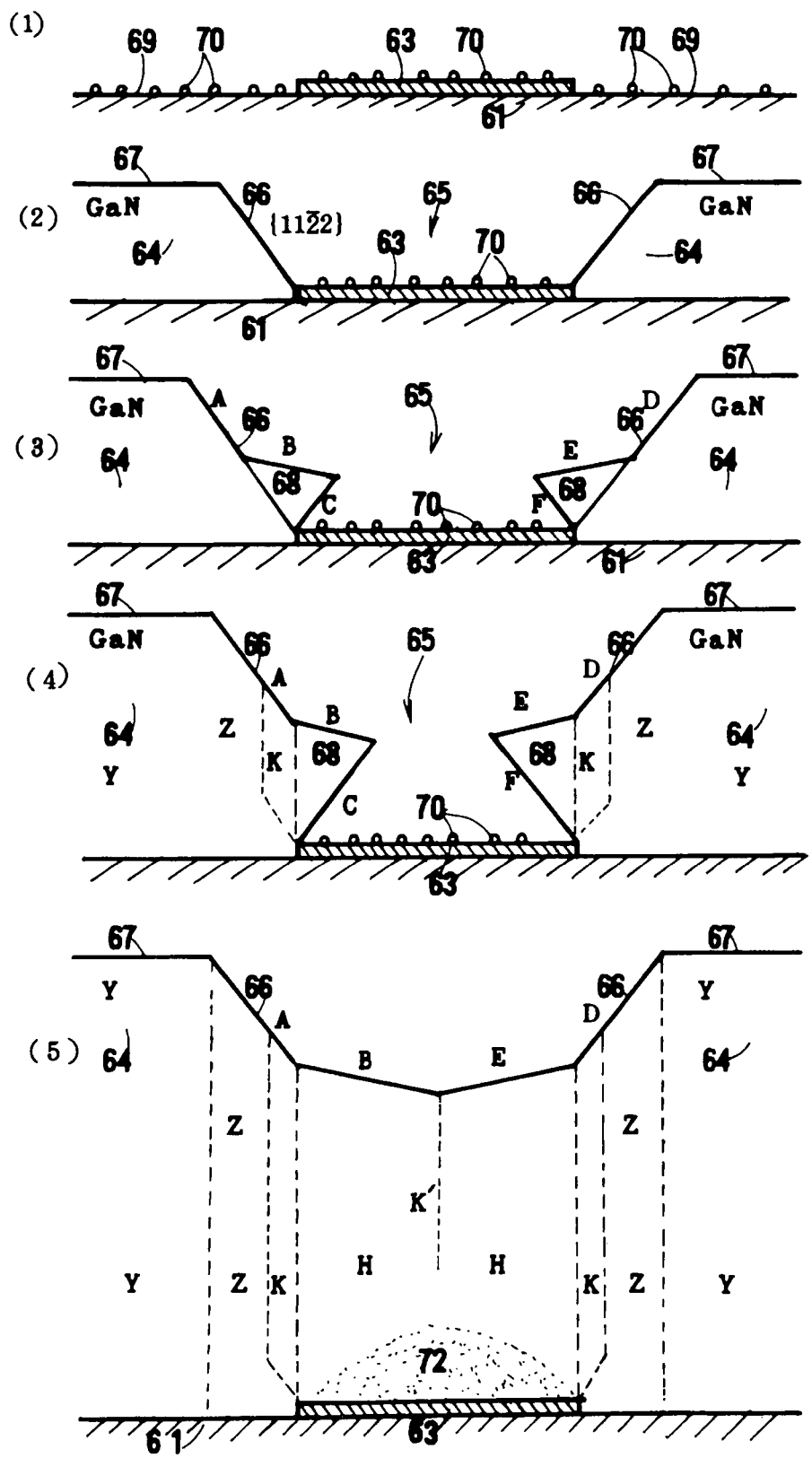
FIG. 9 is plan views showing a further contrived method of facet growth of GaN crystals of the present invention.

FIG. 9 shows a further contrived method of facet growth of GaN crystals. FIG. 9(1) denotes a part of a mask stripe 63 deposited upon an undersubstrate 61. The undersubstrate 61 is a single crystal wafer of GaAs (111). But, other materials, for example, Al$_2$O$_3$(sapphire), Si, SiC, MgO, ZnO, GaAs, InP, GaP, GaN, AlN are available for the undersubstrate. The parallel mask stripes 63 are formed on the undersubstrate 61 by evaporation, CVD, sputtering and photolithography. The stripe mask has a function of inhibiting epitaxial growth of GaN. GaN fine nuclei are grown in vapor phase by, e.g., HVPE on the masked undersubstrate at a low temperature below 700° C., for example, at 500° C.-650° C. Since a low temperature allows plenty of fine GaN nuclei to cover over the stripe mask 63 as well as non-masked parts 69 of the undersubstrate 61.

Then, GaN is grown in vapor phase at a high temperature more than 900° C., for example, at 1050° C. Such a high temperature prohibits GaAs nuclei from adhering to the mask stripes 63. GaN granules adhere only to the non-masked parts 69 of the undersubstrate 61. The non-masked parts 69 are covered with GaN layers 64. Tops of the mask stripes 63 are left uncovered. The GaN layers 64 become trapezoid hills on the non-masked parts 69. A trapezoid hill has a middle plateau 67 and two slanting side facets 66 and 66. The hills have a (0001) orientation. The facets are some low Miller index planes. In the case of the stripes extending in the <1-10> direction on a GaAs (111) single crystal undersubstrate, the facets are {11-22} planes. The low Miller index planes, e.g., {11-22}, are stable. The trapezoid hills 64 are maintained till an enough thickness. FIG. 9(2) shows the parallel hills 64 and parallel vacant spaces on the stripes 63. Stability of {11-22} facets protect the slanting walls of the hills. Abruptly many triangle-sectioned protrusions 68 appear on the slanting facets 66 on sides of the hills 64. The protrusions have inverse orientations. Tops of the protrusions 68 have {11-2-m}(m≧3) orientations. Bottoms of the protrusions 68 are not in contact with the mask 63 but are separated from the mask 63. Many fine random GaN granules 70 on the mask 63 may prevent the protrusions from touching the mask 63. The bottoms of the protrusions 68 have the same index {11-22} as a facing facet {11-22}. The reason why two reverse facets have the same Miller index is that the protrusions have reversed orientation. In FIG. 9(3), A means a left facet, B is a top of the left protrusion, C is a bottom of the left protrusion, D is a right facet, E and F are a top and bottom of the right protrusion. In an ideal example, A=F, C=D, in the concrete,

A (11-22) D(-1-122)
B (-1-12-5) E(11-2-5)
C (-1-122) F(1-22).

The protrusions have a reverse-orientation (000-1). The hills on the non-masked parts have a normal orientation (0001). What is important is that the protrusions invert orientations. Facing pairs of reverse-oriented protrusions expand and bridge over the mask stripes 63 without touching the stripes 63 in the progress of the growth in vapor phase. Existence of random fine GaN particles 70 on the mask allows the protrusions to maintain the reverse orientation and bridge over the stripes 63, as shown in FIG. 9(4). Tips of the pairing protrusions 68 and 68 come into contact with each other. Since pairing facets A and D and pairing protrusions 68 and 68 are not always equivalent, junctions (grain boundaries (K')) of the pairing protrusions are not always just on the middle of the stripe. Heights of the tips are not always equal. The junctions (K') fluctuate right or left from the middle of the stripes. The fluctuating junctions (grain boundaries (K')) of the pairing protrusions 68 are named "lattice misfitting lines" after the zigzag fluctuation.

Vacant spaces beneath the junction above the mask 63 are filled with GaN granules 72. The filling GaN granules 72 grow downward from the bottom C and F planes of the protrusions as shown in FIG. 9(5). The filling GaN granules take the reverse-orientation since the C and F act as seeds. Vacant space above the junction is also filled with GaN granules 65 and 65. The GaN granules 65, which grow on the B and E planes, take the reverse-orientation, since the B and E play a role of a seed. Facet growth of GaN continues without burying the facets. Thus, reverse-oriented GaN grows on the B and E planes. GaN crystals growing on the mask 63 become voluminous defect accumulating regions (H). GaN crystals growing on the facets 66 become low dislocation single crystal regions (Z). GaN crystals growing on the flat plateaus 67 become C-plane growth regions (Y).

Succeeding epitaxial growth sweeps dislocations out of the facet region (Z) and the C-plane region (Y) into the voluminous defect accumulating region (H). The appearance of the paring protrusions 68 and 68 from the facets confirms the formation of the "reverse-oriented" voluminous defect accumulating region (H). Reverse-oriented single crystalline voluminous defect accumulating region (H) is the most reliable, the most endurable, and the most powerful for accumulating dislocations.

GaN/undersubstrate wafers are produced. The undersubstrates are eliminated by etching or polishing. Freestanding GaN single crystal substrates are made. The GaN substrates are not homogeneous but inhomogeneous. The GaN substrates are composed of three different regions H, Z and Y. Properties of the individual H, Y and Z regions should be examined. The followings are electrical, optical, mechanical, thermal properties of the inhomogeneous GaN substrates made by the present invention.

(1) Absorption Coefficients ($\lambda$=300 nm~2000 nm; $\alpha$H, $\alpha$Z, $\alpha$Y)

Absorption for wavelengths 300 nm to 2000 nm is measured for clarifying the difference of the three regions H, Z and Y. A light source produces an examination light beam of a diameter 0.1 mm$\phi$ with wavelengths from 350 nm to 650 nm. The thickness d of a GaN substrate sample is 0.4 mm. Power of incident light power Pi, passing light power Pt and reflected light power Pf are measured. An absorption coefficient $\alpha$ is defined as $\alpha$=log {Pi/(Pi-Pt-Pf)}/d.

$\alpha_H$, $\alpha_Z$, $\alpha_Y$ are absorption coefficients for the voluminous defect accumulating region (H), low dislocation single crystal region (Z) and C-plane growth region (Y).

| Absorption coefficients [cm$^{-1}$] | | | | |
|---|---|---|---|---|
| | 350 nm band | 450 nm band | 550 nm band | 650 nm band |
| $\alpha$H | 1000-10000 | 1-10 | 1-10 | 1-10 |
| $\alpha$Z | 1000-10000 | 1-10 | 1-10 | 1-10 |
| $\alpha$Y | 1000-10000 | 10-100 | 1-10 | 1-10 |
| $\alpha$Y/$\alpha$H | 0.5-2 | 5-20 | 0.5-2 | 0.5-2 |
| $\alpha$Y/$\alpha$Z | 0.5-2 | 5-20 | 0.5-2 | 0.5-2 |

The absorption coefficient for ultraviolet light 350 nm is more than 1000 cm$^{-1}$ and less than 10000 cm$^{-1}$ in all the three regions H, Z and Y. The large absorption derives from bandgap transition absorption. For visible light wavelengths of green 550 nm and red 650 nm, the absorption coefficients $\alpha$ is more than 1 cm$^{-1}$ and less than 10 cm$^{-1}$. Absorption is anomalous for 450 nm blue light. The C-plane region (Y) ($\alpha_Y$=10-100 cm$^{-1}$) absorbs 450 nm blue light about ten times as much as H or Z ($\alpha$H, $\alpha$Z=1-10 cm$^{-1}$). Namely, $\alpha$Y/$\alpha$H=5 to 20. The large absorption of 450 nm blue is due to large carbon inclusion in the C-plane region. The voluminous defect accumulating region (H) and low dislocation single crystal region (Z) absorb carbon little. But, the C-plane growth region (Y) absorbs carbon much in the epitaxial growth.

(2) Etching Speed

An etchant is prepared by mixing phosphoric acid (H$_3$PO$_4$) with sulfuric acid (H$_2$SO$_4$) at a ratio of H$_3$PO$_4$:H$_2$SO$_4$=1:1. Sample GaN wafers are etched by the H$_3$PO$_4$:H$_2$SO$_4$=1:1 etchant at 270° C. for 10 minutes. The etching speed of the voluminous defect accumulating region (H) is higher than 10 μm/h. The etching speed of the C-plane growth region (Y) is less than 0.1 μm/h. The etching speed of the low dislocation single crystal region (Z) is less than 0.1 μm/h. The voluminous defect accumulating region (H) is an easy-etching region. The C-plane growth region (Y) and low dislocation single crystal region (Z) are etching-difficult regions. Etching ratio of H to Z and Y is more than 100.

| | Etching speed | | | |
|---|---|---|---|---|
| Region | Voluminous defect accumulating region (H) | Low dislocation single crystal region (Z) | C-plane growth region (Y) | H/Y or H/Z |
| Etching speed | >10 μm/h | <0.1 μm/h | <0.1 μm/h | >100 |

(3) XRD

XRD is measured for H, Y and Z regions by an apparatus consisting of an X-ray source which emits Cu—K$\alpha$1 line X-rays, two crystals of germanium (220) and a mirror. The incident beam shoots GaN wafer samples in a <11-20> orientation. Diffraction planes are (0004). Intensity distribution of beams diffracted by (0004) planes in a <11-20> direction is measured. The FWHM (full width at half maximum) for H is 100 (arcseconds) to 3600 (arcseconds). Here, 60 arcseconds are 1 arcminute. 60 arcminutes are 1 degree. The FWHM for Z and Y is 10 (arcseconds) to 1000 (arcseconds).

| | XRD | | | |
|---|---|---|---|---|
| Region | Voluminous defect accumulating region (H) | Low dislocation single crystal region (Z) | C-plane growth region (Y) | H/Y or H/Z |
| XRD | 100-3600 (arcseconds) | 10-1000 (arcseconds) | 10-1000 (arcseconds) | 3-10 |

The XRD has two kinds of measurements. One of the XRD measurements is an $\omega$-measurement which measures intensity of peaks of diffracted rays. Positions of the peaks are different for H, Y and Z regions in a common sample GaN wafer. Fluctuation of the peak position of the $\omega$-measurement means fluctuation of crystal orientations in H, Y and Z. The FWHM is a width of the diffraction ray peak at a half height. A narrower FWHM means a better order of crystal orientations. The higher FWHM in H means that the crystal orientation in the H region fluctuates more than Y and Z. Another of the XRD measurements is an $\omega$-2$\theta$ measurement which teaches us plane distances of an object plane group. In the present case, the diffraction plane is (0004). The plane distance of (0004) is equally 0.5185 nm±0.0001 nm for all the H, Y and Z regions. This signifies that all the H, Y and Z regions have the same crystallographical symmetry system.

(4) Electric Resistivity

Figure 10:
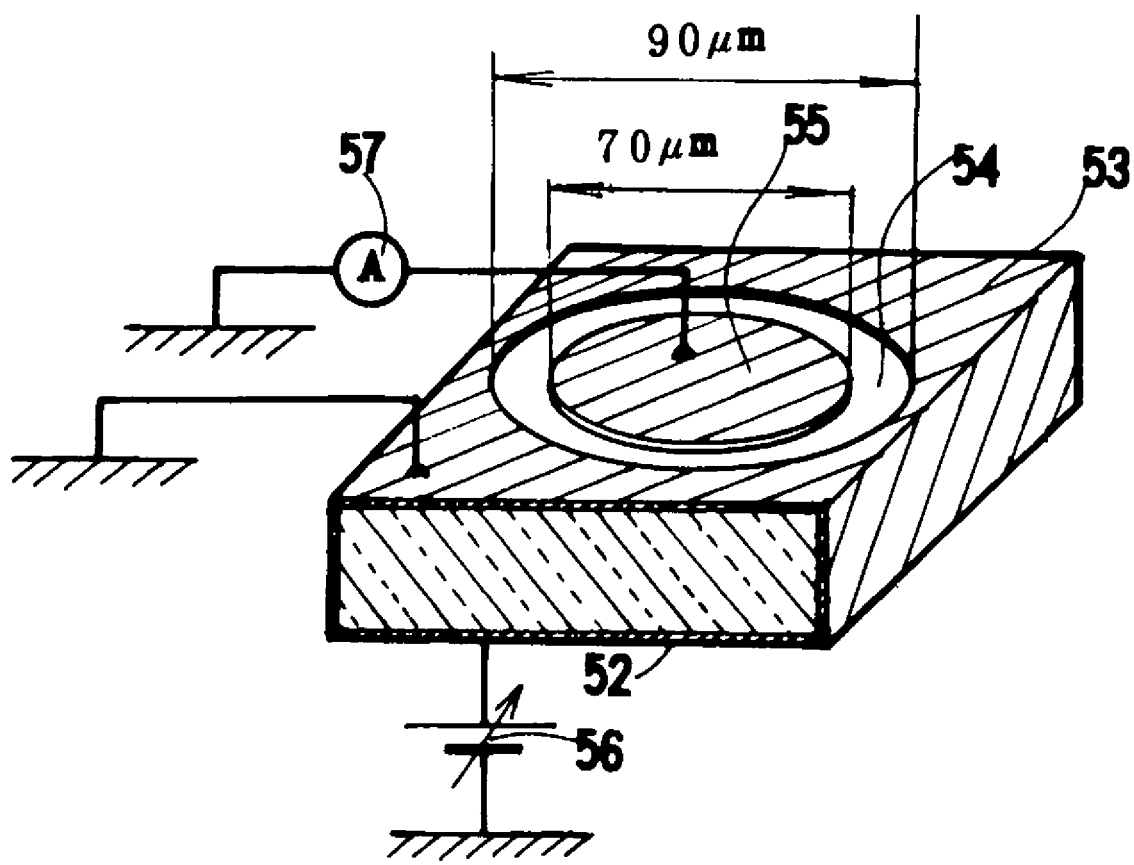
FIG. 10 is an oblique view of a sample GaN wafer produced by the present invention so as to measure the electric resistances in Embodiment 2.

Electric resistances are measured by preparing coating layers on sample GaN wafers as shown in FIG. 10 (a three contact method). A part of the object wafer is shown in the figure. The bottom is coated with a bottom electrode 52. A peripheral part of the top is coated with a guardring electrode 53 with a 90 μm inner diameter for annihilating noise. A central peripheral part on an object region is coated with a searching electrode 55 having a 70 μm diameter. A spacing annulus 54 with a 10 μm width of an 80 μm diameter is interposed between the guardring electrode 53 and the searching electrode 55. The guardring electrode 53 is grounded. The searching electrode 55 is connected via a meter 57 to the ground. The bottom electrode is positively biased by a variable source 56. A resistance R of the object circular region (70 μmφ) is calculated by dividing the voltage V of the source 56 by the current I of the meter 57. Electric resistivity ρ(Ωcm) of the object region is calculated by an equation, $$\rho(\Omega cm) = R(\Omega) \times S(cm^2)/L(cm).$$

Here, S is an area of the object region (70 μmφ) and L(cm) is the thickness of the wafer.

| Resistivity | | | | |
|---|---|---|---|---|
| Region | Voluminous defect accumulating region (H) | Low dislocation single crystal region (Z) | C-plane growth region (Y) | Y/H or Y/Z |
| Resistivity | $10^{-4}$-$10^{-1}$ (Ωcm) | $10^{-4}$-$10^{-1}$ (Ωcm) | $10^{-2}$-$10^{7}$ (Ωcm) | $10$-$10^{7}$ |

The anomaly of electric resistivity is different from the previous properties of the absorption, XRD and etching speed in which H is an anomalous region. But, for the electric resistivity, Y is an anomalous region.

(5) Photoluminescence (PL)

Figure 11:
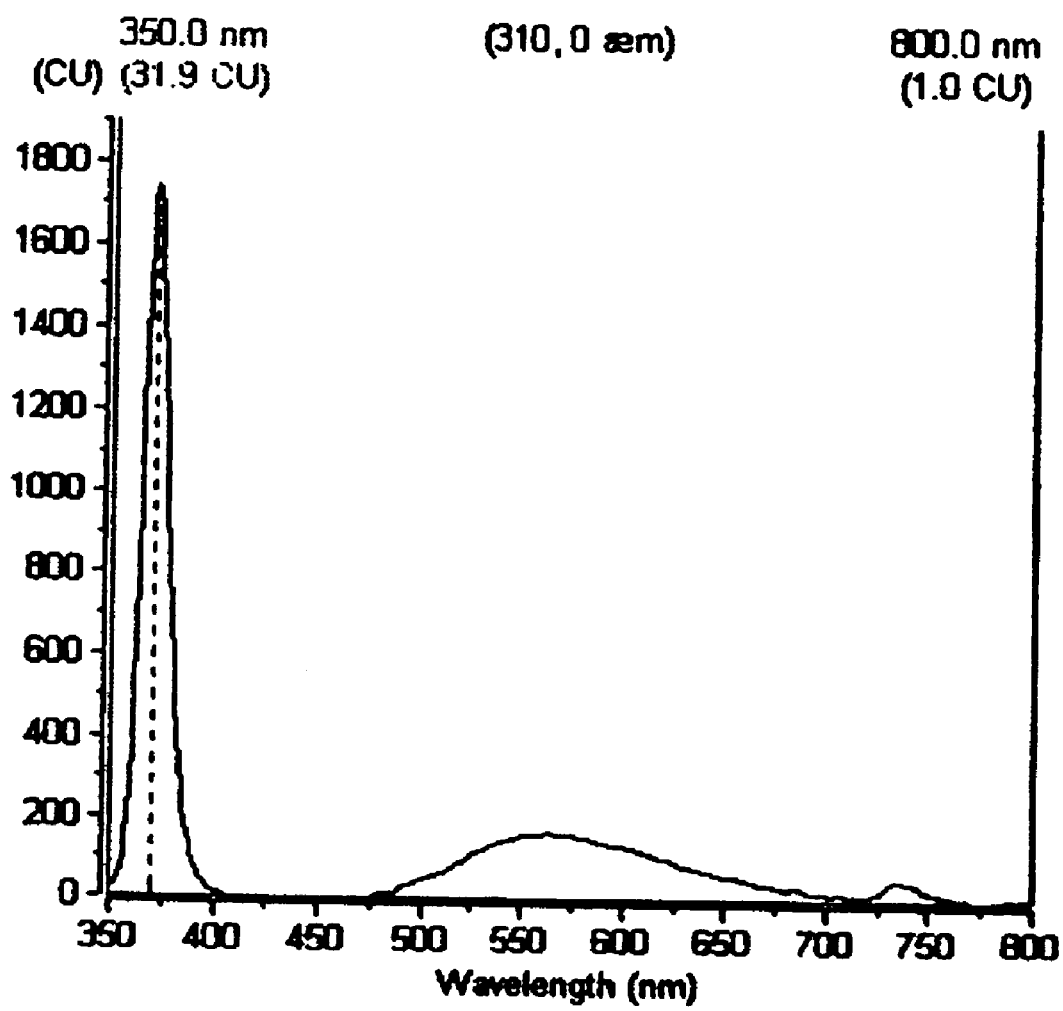
FIG. 11 is a graph showing a photoluminescence measurement result of a voluminous defect accumulating region (H) of the GaN wafer produced by the present invention.
Figure 12:
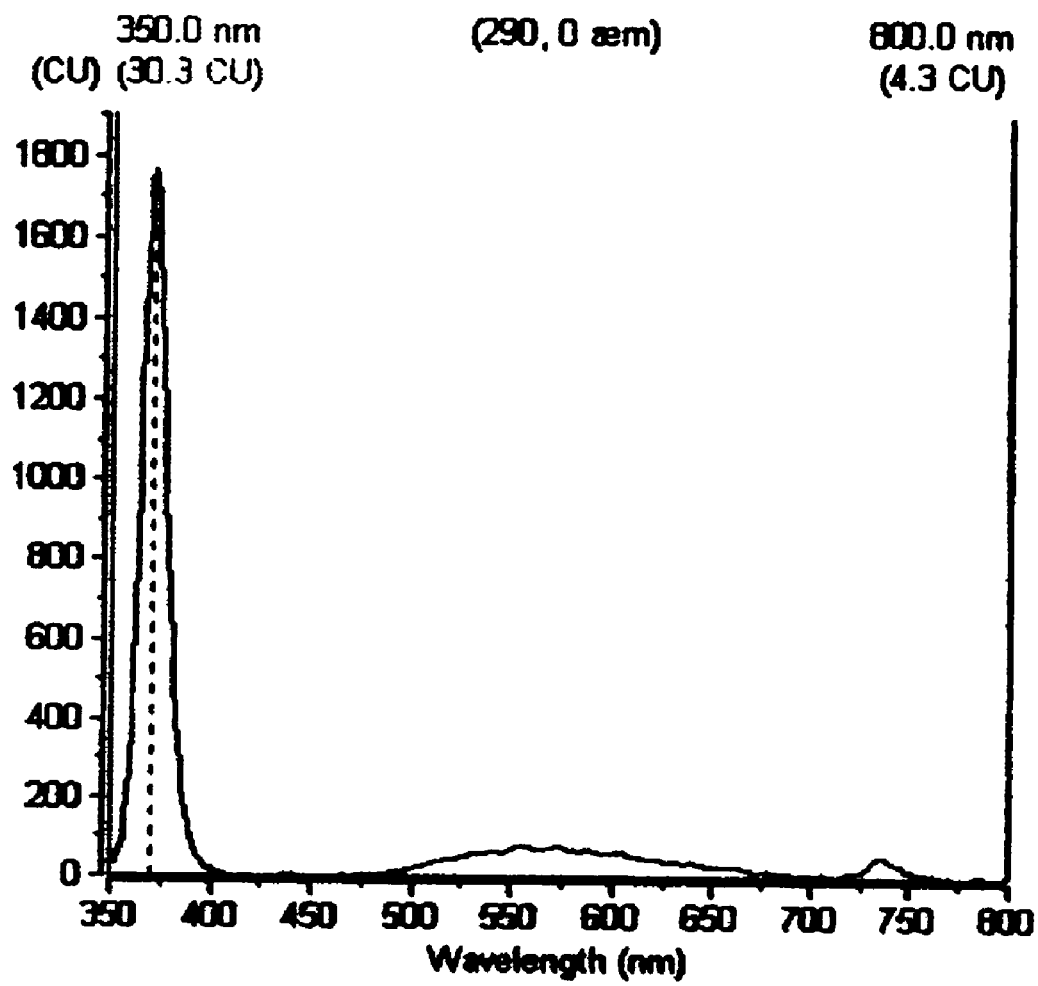
FIG. 12 is a graph showing a photoluminescence measurement result of a low dislocation single crystal region (Z) of the GaN wafer produced by the present invention.
Figure 13:
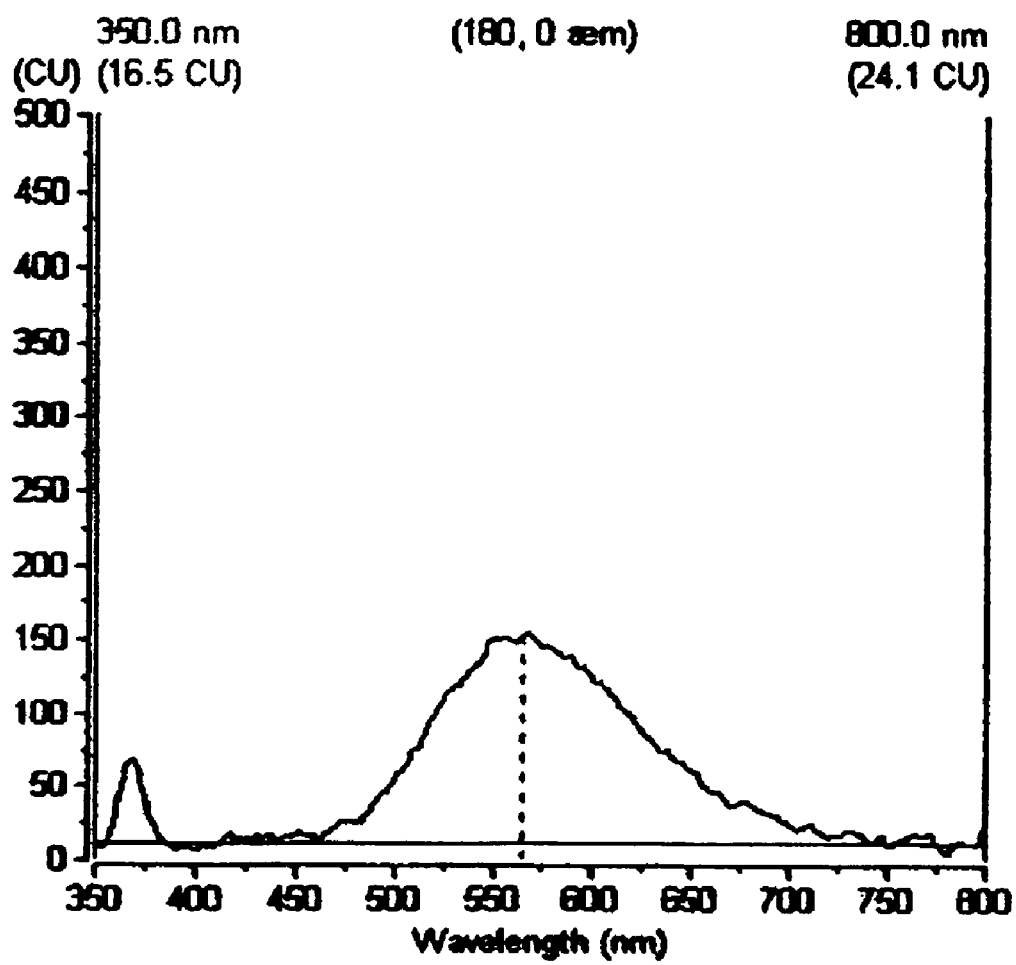
FIG. 13 is a graph showing a photoluminescence measurement result of a C-plane growth region (Y) of the GaN wafer produced by the present invention.

Photoluminescence of the three regions H, Z and Y is examined by a photoluminescence apparatus having an exciting light source of a He—Cd laser for shooting specimens with a 0.1 mmφ beam of 325 nm wavelength ultraviolet rays, spectrometer for selecting wavelengths between 330 nm and 800 nm of photoluminescence, and a power detector for measuring the photoluminescence from the specimens. Photoluminescence curves for the H, Z and Y regions have a sharp, high peak at ultraviolet 360 nm and a broad and a low peak near yellow 560 nm as shown in FIG. 11 (H-region), FIG. 12 (Z-region) and FIG. 13 (Y-region). Absolute values of the photoluminescence strongly vary by changes of incident power of the He—Cd laser, a slit aperture of the spectrometer, and filters. But, ratios of the peak powers of the shorter 360 nm peak and the longer 560 nm peak are stable instead of the changes of the incident power, slit aperture, filters. Then, the ratio of the 360 nm peak to the 560 nm peak is calculated for the three regions H, Z and Y. FIGS. 11, 12 and 13 show the shorter wavelength (360 nm) peak is bigger than the longer wavelength peak (560 nm) for H and Z. The 360/560 ratio is 1730/180=9.6 for H (voluminous defect accumulating region (H)) in FIG. 11. The 360/560 ratio is 1750/90=19.4 for Z (low dislocation single crystal region (Z)) in FIG. 12. But, the 360/560 ratio is 70/160=0.44 for Y (C-plane growth region (Y)) in FIG. 13.

In the case of photoluminescence, the Y region is anomalous, because the Y region has a stronger 560 nm peak and a weaker 360 nm peak. The H and Z show a common tendency having the stronger 360 nm peak and the weaker 560 nm peak. In the results in FIGS. 11-13, the ratio H/Y is 21.8 and the ratio Z/Y is 44. In general, the 360/560 ratios are 1-1000 for H and Z. The 360/560 ratios are 0.01-10 for Y. The ratio of H/Y or Z/H is 10 to $10^5$ times.

| PL: 360 nm/560 nm PL peak ratio (He—Cd: 325 nm) | | | | |
|---|---|---|---|---|
| Region | Voluminous defect accumulating region (H) | Low dislocation single crystal region (Z) | C-plane growth region (Y) | Y/H or Y/Z |
| 360 nm/560 nm PL peak ratio | 1-1000 | 1-1000 | 0.01-10 | $10$-$10^5$ |

The absorption at 360 nm corresponds the bandgap transition of GaN. The sharp high 360 nm peaks appearing in the H and Z regions (FIGS. 11 and 12) signify high purity of H and Z. The wide, high 560 nm absorption peak in the Y region (FIG. 13) means that Y includes rich carbon. The result means that the facet growth has a function of excluding carbon atoms and maintaining purity of growing GaN crystals. Conventional C-plane growth is subject to carbon contamination. High carbon-resistance is another advantage of the facet-growth on which the present invention relies.

(6) Distortion

Distortion, which is not a localized property inherent in the Y, Z, H regions, is a non-local property, which can be defined by a distortion height or a distortion curvature radius. Distortion curvature radii of the GaN wafers made by the present invention are 600 mm at least. Better GaN wafers have good flatness where the distortion curvature radius is longer than 1500 mm. Curvature radii of all the freestanding GaN wafers of the present invention range from 1000 mm to 50000 mm. In practice, heights of centers are measured by pushing the centers by an adjustable needle. The wafer size is 50 mmφ. A <1-100> direction shows less than about 50 μm of distortion height. A <11-20> direction shows less than about 50 μm of distortion height. The curvature radius corresponding to 50 μm is 60 cm (600 mm). The curvature radius is more than 600 mm.

(7) Impurity Concentration

SIMS(secondary ion mass spectrometer) analyzes impurity concentration in each of the H, Z and Y regions of polished GaN sample wafers prepared by the method of the present invention. The SIMS bombards specimens with an accelerated Cs+ ion beam for exiling impurity atoms, bends the impurity atom beam by a fan-shaped magnet, and measures numbers of atoms bent in various angles. The object area of the SIMS measurement is 50 μmφ. The measuring depth is 0 μm to 5 μm. The H, Z and Y regions contain oxygen(O), silicon (Si) and arsenic (As).

| Impurity concentration | | | |
|---|---|---|---|
| | O (cm$^{-3}$) | Si (cm$^{-3}$) | As (cm$^{-3}$) |
| H | $10^{16}$-$10^{20}$ | $10^{16}$-$10^{20}$ | $\leq 10^{17}$ |
| Z | $10^{16}$-$10^{20}$ | $10^{16}$-$10^{20}$ | $\leq 10^{17}$ |
| Y | $\leq 10^{18}$ | $10^{16}$-$10^{20}$ | $\leq 10^{17}$ |
| Y/H | $10^{-1}$-$10^{-5}$ | 1 | 1 |
| Y/Z | $10^{-1}$-$10^{-5}$ | 1 | 1 |

(8) Wafer Size

Wafers produced by the method of the present invention have the following ranges of sizes.

Rectangular wafers; 10 mm≦sides≦160 mm

Round wafers; 10 mm≦diameter≦160 mm

Thickness; 5 μm≦thickness≦2000 μm

Rectangular wafers have an advantage of facilitating the identification of resonator mirror planes in fabricating laser diodes. One of the sides of the rectangular wafers coincides with the resonator mirror planes.

Circular wafers, which have rotation symmetry, a diameter of, for example, 50 mmφ, and a thickness of, for example, 400 μm, exhibit an advantage of enabling material gases to make uniform streams and to synthesize uniform epitaxial films without epitaxy anomalies. Smaller wafers having a size less than 10 mm induce random gas flows and incur epitaxy anomalies at wafer edges. Large wafers bigger than a 160 mm diameter invite large distortion heights. The present invention takes, for example, gallium arsenide (GaAs) wafers as undersubstrates. The maximum size of the GaAs wafer sold on the market is 150 mmφ (six inches) at present.

(9) Three Dimensional Structure (FIG. 14)

Widths of the H, Y and Z regions vary in the progress of crystal growth. H and Y diminish during epitaxial growth. Namely, the widths of H and Y on the top (Ga-surface) are narrower than the widths of H and Y on the bottom. The width of Z increases during the epitaxial growth. FIG. 14 shows the changes of thicknesses of H, Z and Y. The decrease of the H width is 0.001×t to 0.1×t, where t is the thickness of the object GaN wafer.

<11-20> direction as object points and scans the ten fields of vision in the <11-20> direction. Cathode luminescence can discern H, Y, Z and dislocations. Dislocation density is obtained by counting the number of dislocations in a definite area and dividing the number by the area.

[Sample 1 (TEM Observation)]

A GaN wafer made by the method of the present invention shows dislocation distribution on H, Z and Y as follows.

H; $1\times10^7$ cm$^{-2}$-$2\times10^7$ cm$^{-2}$

Z; $1\times10^5$ cm$^{-2}$-$1\times10^7$ cm$^{-2}$

Y; $2\times10^4$ cm$^{-2}$-$2\times10^5$ cm$^{-2}$

[Sample 2 (TEM Observation)]

Another GaN wafer made by the method of the present invention shows dislocation distribution on H, Z and Y as follows.

H; $5\times10^7$ cm$^{-2}$-$1\times10^8$ cm$^{-2}$

Z; $3\times10^5$ cm$^{-2}$-$3\times10^7$ cm$^{-2}$

Y; $2\times10^5$ cm$^{-2}$-$1\times10^6$ cm$^{-2}$

Dislocation density fluctuates even in the same regions of H, Z and Y in a sample. In general, H has the highest density.

The voluminous defect accumulating region (H) is anomalous regarding dislocation density. H has dislocations more than Y and Z (H>Y, H>Z). In the H region, the dislocation density is $5\times10^6$ cm$^{-2}$ to $5\times10^8$ cm$^{-2}$. More than 50% of the Z region has low dislocations less than $5\times10^6$ cm$^{-2}$. More than 60% of the Y region has low dislocations less than $5\times10^6$ cm$^{-2}$. General tendency is H>Z>Y in dislocations.

| | Dislocation density | | | |
|---|---|---|---|---|
| Region | Voluminous defect accumulating region (H) | Low dislocation single crystal region (Z) | C-plane growth region (Y) | Z/H or Y/H |
| Dislocation density | $5 \times 10^6$-$5 \times 10^8$ (cm$^{-2}$) | <$5 \times 10^6$ (cm$^{-2}$) (more than 50%) | <$5 \times 10^6$ (cm$^{-2}$) (more than 60%) | $10^{-3}$-$10^{-1}$ |

The coefficients vary from 0.001 to 0.1 by the conditions of epitaxial growth.

| | Width change of H, Z and Y | | | |
|---|---|---|---|---|
| Region | Voluminous defect accumulating region (H) | Low dislocation single crystal region (Z) | C-plane growth region (Y) | Rate to thickness |
| Width change | Decrease | Increase | Decrease | $10^{-1}$-$10^{-3}$ |

(10) Dislocation Density

Since GaN is transparent, an optical microscope cannot observe dislocations on GaN wafers. Dislocations are observed by TEM (Transmission Electron Microscope) and CL (Cathode Luminescence). The TEM, which has a 10 μm×10 μm field of vision, takes ten sequential fields of vision beginning from an arbitrary point extending in the

(11) Thermal Conductivity

Thermal conductivity Q (W/ms) is measured on GaN samples (15 mm×15 mm×0.8 mm) prepared by cutting a planar crystal of 15 mm×15 mm from the GaN wafer made by the present invention and polishing both surfaces into a 0.8 mm thickness. Heat diffusion rate D (m$^2$/s) of the samples is measured by a laser flash method. Specific heat C (kJ/kgK) is measured by a DSC method. Specific gravity ρ(kg/m$^3$) is measured by an Archimedes method. Thermal conductivity is obtained by the equation, $$Q(W/\text{ms})=\rho(\text{kg/m}^3)\times C(\text{kJ/kgK})\times D(\text{m}^2/\text{s}).$$

Heat diffusion rate D has directivity, since the GaN made by the present invention has anisotropy. The heat diffusivity parallel with the stripes (H, Z, Y) is denoted by Dp. The heat diffusivity perpendicular to the stripes (H, Z, Y) is denoted by Dt. Thus, Qp means parallel thermal conductivity. Qt is perpendicular thermal conductivity which corresponds to a heat flow crossing H, Z, Y, . . . stripes.

Thermal conductivity

| Thermal conductivity | Sample 3 | Sample 4 | Sample 5 | Sample 6 | Sample 7 |
|---|---|---|---|---|---|
| Qt (W/mK) | 170 | 191 | 205 | 195 | 182 |
| Qp (W/mK) | 178 | 185 | 210 | 197 | 181 |

The results show there is no anisotropy in the parallel and perpendicular directions, since Qt is always nearly equal to Qp. The thermal conductivity ranges from 150 W/mK to 220 W/mK.

(12) Vickers Hardness

Vickers hardness is measured on the H, Z and Y regions by pushing down a diamond rectangular cone on object positions (H, Z and Y) with an application load P(kgf), measuring a diagonal length "a" of a pit made by the cone, and calculating Vickers hardness Hv by an equation, $Hv = 1.8544 \times P/a^2$ Here, the application load is 50 kgf to 200 kgf.

Vickers hardness

| Vickers hardness | Sample 3 | Sample 4 | Sample 5 | Sample 6 | Sample 7 |
|---|---|---|---|---|---|
| H | 1270 | 1340 | 1310 | 1380 | 1480 |
| Z | 1260 | 1710 | 1510 | 1450 | 1520 |
| Y | 1340 | 1740 | 1550 | 1530 | 1580 |

Vickers hardness turns out to be anomalous for H, Z and Y. The voluminous defect accumulating region (H) has the lowest Hv. Since H includes many defects, H is the softest among three regions. The C-plane growth region (Y) is the highest Hv. Since Y is the most perfect regularity, the C-plane growth region (Y) is the hardest among three. The Vickers hardness is 1200-1500 Hv for H, 1200-1800 Hv for Z and 1300-1800 Hv for Y.

(13) Flaw Density

Surfaces of GaN crystal wafers have flaws as defects in addition to the dislocations. Flaw density is defined by the number of flaws crossed by an arbitrary drawn 1 mm long line. A differential interference microscope can discern flaws randomly distributing on the surfaces of GaN wafers. The wafers are photographed by the differential interference microscope with a field of vision of 300 μm×400 μm at a magnifying ratio of 40 times. The flaw density is obtained by drawing a definite length examination line on the photograph, counting the number of the flaws crossing the examination line, and dividing the crossing flaw number by an actual examination line length (mm).

Flaw density

| Flaw density (lines/mm) | Sample 3 | Sample 4 | Sample 5 | Sample 6 | Sample 7 |
|---|---|---|---|---|---|
| H | $8 \times 10^4$ | 2 | $1 \times 10^3$ | $1.1 \times 10^3$ | 12 |
| Z | $2.4 \times 10^4$ | 1 | $9.8 \times 10^2$ | $1 \times 10^3$ | 18 |
| Y | $9.3 \times 10^4$ | 3 | $8.3 \times 10^2$ | $1.2 \times 10^3$ | 15 |

The flaw density has no anomaly depending upon H, Z and Y. The flaw density is less than $1 \times 10^5$ lines/mm for all H, Z and Y.

(14) Crystal Growth Speed

The same sapphire substrate as Embodiment 1 is used as an undersubstrate. The striped mask pattern A3 is formed on the undersubstrate and a GaN buffer layer is formed in the same conditions as Embodiment 1. Then, the temperature is raised to 1000° C., an epitaxial layer is grown on the buffer layer for 60 minutes in various conditions of the following table, and the growth states of the voluminous defect accumulating regions (H) grown on stripes are confirmed.

Crystal growth conditions

| | Condition 1 | Condition 2 | Condition 3 | Condition 4 | Condition 5 |
|---|---|---|---|---|---|
| NH₃ partial pressure (atm) | 0.15 | 0.2 | 0.2 | 0.25 | 0.25 |
| HCl partial pressure (atm) | 0.003 | 0.006 | 0.01 | 0.02 | 0.03 |
| Growth speed (μm/h) | 11 | 30 | 53 | 100 | 155 |

The results of the growth are such confirmed that the growth of the voluminous defect accumulating regions (H) is insufficient and some areas without the voluminous defect accumulating region (H) are found under the conditions 1 and 5, but the growth of (H) is successful under the conditions 2, 3 and 4. Consequently, the growth speed of the conditions 2, 3 and 4 is preferable. Namely, the crystal growth speed of the GaN crystals of the present invention is preferably between 30 μm/h and 100 μm/h.

What we claim is:

1. A method of growing a GaN crystal comprising the steps of:
   preparing an undersubstrate;
   forming a striped mask pattern made of a material inhibiting GaN from growing partially on the undersubstrate;
   forming parallel stripe-masked parts which are parts of the undersubstrate covered with mask stripes of the striped mask pattern and parallel non-masked parts which are parts of the undersubstrate not covered with the mask stripes;
   epitaxially growing the GaN crystal on the non-masked parts of the undersubstrate but not growing the GaN crystal on the stripe-masked parts of the undersubstrate at the beginning of GaN growth;
   forming a plurality of linearly extending parallel GaN facet hills having facets slantingly extending from edges of the stripe-masked parts to the non-masked parts;
   forming protrusions of GaN crystals which have reversed orientation different from that of the GaN crystal on the non-masked parts by 180 degrees and project slantingly from the slanting facets;
   extending the protrusions so as not to touch the mask stripes;
   unifying the protrusions near an upper middle of the stripe-masked parts;
   covering the whole stripe-masked parts with the protrusions;

increasing a thickness of the GaN crystal on the non-masked parts with growing of the protrusions above the stripe-masked parts;

increasing a thickness of the GaN crystal as a whole; and obtaining the GaN crystal having normal-oriented regions formed on the non-masked parts and the reverse-oriented regions formed on the stripe-masked parts.

2. The method according to claim 1, wherein the GaN crystal is grown at a first low temperature between 400° C. and 600° C., and then, the facet hills having the facets are formed and the protrusions of GaN are formed from the facets while the GaN crystal is epitaxially grown at a second temperature between 900° C. and 1100° C.

3. The method according to claim 1, wherein GaN fine polycrystalline granules are heaped on the stripe-masked parts during an early stage of growth at a first low temperature.

4. The method according to claim 1, wherein a crystal growth speed is 30 μm/h to 100 μm/h when the protrusions having the reversed orientation cover the whole stripe-masked parts.

5. A method of producing a single crystal GaN substrate comprising the steps of:

preparing an undersubstrate;

forming a striped mask pattern made of a material inhibiting GaN from growing partially on the undersubstrate;

forming parallel stripe-masked parts which are parts of the undersubstrate covered with mask stripes of the striped mask pattern and parallel non-masked parts which are parts of the undersubstrate not covered with the mask stripes;

epitaxially growing GaN crystals on the non-masked parts of the undersubstrate but not growing a GaN crystal on the stripe-masked parts of the undersubstrate at the beginning of GaN growth;

forming the GaN crystal with normal orientation (0001) defined by an upward c-axis on the non-masked parts of the undersubstrate;

forming a plurality of linearly extending parallel GaN facet hills having facets slantingly extending from edges of the stripe-masked parts to the non-masked parts;

making a plurality of reverse-oriented (000-1) protrusions which have a downward c-axis, do not touch the mask stripes at the beginning of GaN growth, and project slantingly from the slanting GaN facets;

unifying the reverse-oriented protrusions extending from facing facets above centers of the mask stripes while growing the normal-oriented (0001) GaN crystal with the facets;

piling epitaxially GaN on the unified protrusions;

forming reverse-oriented (000-1) voluminous defect accumulating regions (H) on the mask stripes;

forming normal-oriented (0001) low dislocation single crystal regions (Z) accompanying the facets on the non-masked parts without burying the facets;

forming normal-oriented (0001) C-plane growth regions (Y) growing between the adjoining low dislocation single crystal regions (Z) and (Z) while maintaining a flat C-plane;

forming grain boundaries (K) accompanying orientation reverse between the voluminous defect accumulating regions (H) and the low dislocation single crystal regions (Z);

forming lattice misfitting grain boundaries (K') generated by lattice misfit in unification of the protrusions;

increasing thicknesses of the regions (Z)(Y)(H) by epitaxial growth without burying the facets;

obtaining a binary substrate composed of a GaN substrate having a " . . . HZYZHZYZH . . . " or " . . . HZHZ . . . " structure and the undersubstrate;

eliminating the undersubstrate from the GaN substrate by grinding or etching; and obtaining a freestanding single crystal GaN substrate having the " . . . HZYZHZYZH . . . " or " . . . HZHZ . . . " structure.

6. The method according to claim 5, wherein a thin GaN buffer layer is preliminarily formed on the undersubstrate before forming the striped mask.

7. The method according to claim 5, wherein dislocations of the low dislocation single crystal regions (Z) and the C-plane growth regions (Y) are reduced by growing the facets upward, attracting the dislocations to manifold lines at the bottom of the facets, accumulating the dislocations in the voluminous defect accumulating regions (H) and the grain boundaries (K), annihilating a part of the dislocations, and holding the rest of the dislocations in the voluminous defect accumulating regions (H) and the grain boundaries (K) permanently, and the voluminous defect accumulating regions (H) serve as an annihilation/accumulation place of the dislocations.

8. The method according to claim 5, further comprising a step of polishing a top surface and a bottom surface of the freestanding GaN substrate.

9. The method according to claim 5, wherein top surfaces of the low dislocation single crystal regions (Z) and the C-plane growth regions (Y) are Ga-planes and top surfaces of the voluminous defect accumulating regions (H) are N-planes.

10. The method according to claim 5, wherein top surfaces of the growing C-plane growth regions (Y) are (0001) planes, top surfaces of the growing low dislocation single crystal regions (Z) are {11-22} facets or {1-101} facets and top surfaces of the growing voluminous defect accumulating regions (H) are shallowly slanting facets.

11. The method according to claim 10, wherein the shallowly slanting facets on the voluminous defect accumulating regions (H) incline at 25 degrees to 35 degrees to a horizontal plane.

12. The method according to claim 10, wherein the shallowly slanting facets on the voluminous defect accumulating regions (H) are {11-2-6} facets, {11-2-5} facets or other facets inclining at a small angle to {11-2-6} or {11-2-5} facets.

13. The method according to claim 5, wherein the protrusions appearing on the facets have upper surfaces of {11-2-6}, {11-2-5} facets or other facets inclining at a small angle to the {11-2-6}, {11-2-5} facet and lower surfaces of {11-22} facets having a larger inclination angle to a horizontal plane.

14. The method according to claim 5, wherein the voluminous defect accumulating regions (H) have continual grain boundaries (K') induced by unifying the protrusions at centers, and the grain boundaries (K') annihilate a part of the dislocations and hold the rest of the dislocations permanently.

15. The method according to claim 5, wherein top surfaces of the growing C-plane growth regions (Y) are (0001) planes, top surfaces of the growing low dislocation single crystal regions (Z) are {11-22} planes, top surfaces of the growing orientation-inverse voluminous defect accumulating regions (H) are {11-2-m} planes (m=3, 4, 5, 6, 7, 8, 9 . . . ) and bottoms of the protrusions projecting from the facets are {11-22} planes.

16. The method according to claim 5, wherein top surfaces of the C-plane growth regions (Y) are (0001) planes, top surfaces of the low dislocation single crystal regions (Z) are {11-22} and {1-101} facets, top surfaces of the voluminous defect accumulating regions (H) are {11-2-m} (m=3, 4, 5, 6, 7, 8, 9 . . . ) and {1-10-n} (n=2, 3, 4, 5 . . . ) planes and bottoms of the protrusions projecting from the facets are {11-22} and {1-101} facets.

17. The method according to claim 5, wherein the mask stripes have a pitch of 100 μm to 1000 μm.

18. The method according to claim 5, wherein the mask stripes have a width of 5 μm to 100 μm.

19. The method according to claim 5, wherein the GaN crystal is grown at a first low temperature between 400° C. and 600° C., and then, the facet hills having the facets are formed and the protrusions of GaN are formed from the facets while the GaN crystal is epitaxially grown at a second temperature between 900° C. and 1100° C.

20. The method according to claim 5, wherein GaN fine polycrystalline granules are heaped on the stripe-masked parts during an early stage of growth at a first low temperature.

21. The method according to claim 5, wherein a plurality of fine GaN polycrystalline granules made by low temperature growth at an early step of the growth prevent GaN crystals having the same orientation as the facets from extending horizontally from a facet lower part to the stripe-masked part and have functions of separating the reverse-oriented protrusions from the mask stripes and extending the protrusions from the facets.

22. The method according to claim 5, wherein a crystal growth speed is 30 μm/h to 100 μm/h when the protrusions having the reversed orientation cover the whole stripe-masked parts.

23. The method according to claim 5, wherein the striped mask for inhibiting GaN epitaxial growth is made of one of amorphous or polycrystalline silicon oxide ($SiO_2$), silicon nitride (SiN), alumina ($Al_2O_3$), aluminum nitride (AlN), zirconium oxide ($ZrO_2$), yttrium oxide ($Y_2O_3$) and magnesium oxide (MgO).

24. The method according to claim 5, wherein the under-substrate is one of a sapphire ($Al_2O_3$) single crystal, a silicon (Si) single crystal, a silicon carbide (SiC) single crystal, a magnesium oxide (MgO) single crystal, a zinc oxide (ZnO) single crystal, a gallium arsenide (GaAs) single crystal, an indium phosphide (InP) single crystal, a gallium phosphide (GaP) single crystal, a gallium nitride (GaN) single crystal and an aluminum nitride (AlN) single crystal.

25. A single crystal GaN substrate comprising:
a plurality of voluminous defect accumulating regions (H) which are positioned in predetermined plural places, have a predetermined size, and have reversed orientation (000-1);
low dislocation single crystal regions (Z) which adjoin the voluminous defect accumulating regions (H), have a predetermined size, and have normal orientation (0001);
C-plane growth regions (Y) which are sandwiched between the next plural low dislocation single crystal regions (Z) and (Z) and have normal orientation (0001);
grain boundaries (K) which are generated by orientation reverse on the boundaries between the voluminous defect accumulating regions (H) and the low dislocation single crystal regions (Z); and
grain boundaries (K') which are made of lattice misfit lines in the voluminous defect accumulating regions (H),
wherein a lot of dislocations are caught and held in the grain boundaries (K)(K') and a structure of " . . . HZYZHZYZH . . . " or " . . . HZHZ . . . " is composed of the regions (H)(Z)(Y).

26. The single crystal GaN substrate according to claim 25, wherein discrepancy of the orientations of the neighboring regions at the lattice misfit lines is less than 5 degrees.

27. The single crystal GaN substrate according to claim 25, wherein absorption coefficients for a 350 nm wavelength range from 1000 $cm^{-1}$ to 10000 $cm^{-1}$ in the voluminous defect accumulating regions (H), the low dislocation single crystal regions (Z), and the C-plane growth regions (Y), absorption coefficients for 550 nm and 650 nm wavelengths range from 1 $cm^{-1}$ to 10 $cm^{-1}$ in the voluminous defect accumulating regions (H), the low dislocation single crystal regions (Z), and the C-plane growth regions (Y), absorption coefficients for a 450 nm wavelength range from 1 $cm^{-1}$ to 10 $cm^{-1}$ in the voluminous defect accumulating regions (H) and the low dislocation single crystal regions (Z) but range from 10 $cm^{-1}$ to 100 $cm^{-1}$ in the C-plane growth regions (Y), and a ratio of Y/H or Y/Z of the absorption coefficients for the 450 nm wavelength is 5 to 20.

28. The single crystal GaN substrate according to claim 25, wherein etching speeds for an etchant $H_3PO_4$:$H_2SO_4$=1:1 at 270° C. are more than 10 μm/h for the voluminous defect accumulating regions (H) but less than 0.1 μm/h for the C-plane growth regions (Y) and the low dislocation single crystal regions (Z), and a ratio H/Z or H/Y of the etching speed is more than 100.

29. The single crystal GaN substrate according to claim 25, wherein FWHM (full width at half maximum) of diffracted X-rays for incidence X-rays of Cu—Kα1 line shooting in a <11-20> direction and being diffracted by (0004) planes is 100 arcseconds to 3600 arcseconds for the voluminous defect accumulating regions (H), 10 arcseconds to 1000 arcseconds for the low dislocation single crystal regions (Z) and the C-plane growth regions (Y) and a ratio H/Z or H/Y of the FWHM is 3 to 10.

30. The single crystal GaN substrate according to claim 25, wherein electric resistivity is $10^{-4}$ Ωcm to $10^{-1}$ Ωcm in the voluminous defect accumulating regions (H) and the low dislocation single crystal regions (Z) but $10^{-2}$ Ωcm to $10^7$ Ωcm in the C-plane growth regions (Y) and a ratio Y/Z or Y/H of the electric resistivity is 10 to $10^7$.

31. The single crystal GaN substrate according to claim 25, wherein a ratio of photoluminescence intensity of 360 nm to photoluminescence intensity of 560 nm is 1 to 1000 times for the voluminous defect accumulating regions (H) and the low dislocation single crystal regions (Z) but the ratio is 0.01 to 10 times for the C-plane growth regions (Y) and a ratio Y/H or Y/Z of the photoluminescence ratios is 10 to $10^5$ times.

32. The single crystal GaN substrate according to claim 25, wherein distortion curvature radius is 600 mm to 50000 mm.

33. The single crystal GaN substrate according to claim 25, wherein oxygen concentration is less than $10^{18}$ $cm^{-3}$ in the C-plane growth regions (Y) but is $10^{16}$ $cm^{-3}$ to $10^{20}$ $cm^{-3}$ in the voluminous defect accumulating regions (H) and the low dislocation single crystal regions (Z) and a ratio of Y/H or Y/Z of the oxygen concentration is $10^{-5}$ to $10^{-1}$.

34. The single crystal GaN substrate according to claim 25, wherein the GaN substrate is a rectangular wafer and a side of the rectangle is 10 mm to 160 mm and a thickness of the wafer is 5 μm to 2000 μm.

35. The single crystal GaN substrate according to claim 25, wherein the GaN substrate is a round wafer, a diameter of the wafer is 10 mm to 160 mm and a thickness of the wafer is 5 μm to 2000 μm.

36. The single crystal GaN substrate according to claim 25, wherein widths of the voluminous defect accumulating regions (H) and the C-plane growth regions (Y) on the top are narrower than that on the bottom, but widths of the low dislocation single crystal regions (Z) on the top are wider than that on the bottom.

37. The single crystal GaN substrate according to claim 36, wherein decreasing ratios of the widths of the voluminous defect accumulating regions (H) and the C-plane growth regions (Y) are 0.0001 t to 0.1 t, where t is a thickness of the GaN substrate.

38. The single crystal GaN substrate according to claim 25, wherein dislocation density of the grain boundaries (K)(K') catching and holding dislocations is $10^6$ cm$^{-2}$ to $10^9$ cm$^{-2}$, dislocation density of the voluminous defect accumulating regions (H) is $5\times10^6$ cm$^{-2}$ to $5\times10^8$ cm$^{-2}$, dislocation density of more than 50% of the low dislocation single crystal regions (Z) is less than $5\times10^6$ cm$^{-2}$, dislocation density of more than 60% of the C-plane growth regions (Y) is less than $5\times10^6$ cm$^{-2}$, a ratio of Z/H of the dislocation density is $10^{-3}$ to $10^{-1}$, and a ratio of Y/H of the dislocation density is $10^{-3}$ to $10^{-1}$.

39. The single crystal GaN substrate according to claim 25, wherein thermal conductivity is isotropic and 150 W/mK to 220 W/mK in both directions parallel and vertical to the mask stripes.

40. The single crystal GaN substrate according to claim 25, wherein Vickers hardness is 1200-1600 Hv for the H regions, 1200-1800 Hv for the Z regions and 1300-1800 Hv for the Y region.

41. The single crystal GaN substrate according to claim 25, wherein flaw density is less than $10^5$ lines/mm for all the H, Z and Y regions.

42. The single crystal GaN substrate according to claim 25, wherein the voluminous defect accumulating regions (H), the low dislocation single crystal regions (Z), and the C-plane growth regions (Y) are parallel repeated in an order of . . . HZYZHZYZ . . . , a width of the voluminous defect accumulating region (H) is 5 μm to 100 μm, and a pitch of repetition is 100 μm to 1000 μm.

43. The single crystal GaN substrate according to claim 25, wherein the voluminous defect accumulating regions (H), the low dislocation single crystal regions (Z), and the C-plane growth regions (Y) are extended in a <1-100> direction.

* * * * *